(12) United States Patent
Muramoto

(10) Patent No.: US 10,622,242 B2
(45) Date of Patent: Apr. 14, 2020

(54) SUBSTRATE INVERTING DEVICE, SUBSTRATE PROCESSING APPARATUS, AND SUBSTRATE SUPPORTING DEVICE, AND SUBSTRATE INVERTING METHOD, SUBSTRATE PROCESSING METHOD, AND SUBSTRATE SUPPORTING METHOD

(71) Applicant: SCREEN Holdings Co., Ltd., Kyoto (JP)

(72) Inventor: Ryo Muramoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 34 days.

(21) Appl. No.: 16/043,197

(22) Filed: Jul. 24, 2018

(65) Prior Publication Data

US 2019/0067077 A1  Feb. 28, 2019

(30) Foreign Application Priority Data

Aug. 30, 2017  (JP) .................................. 2017-165317

(51) Int. Cl.
*H01L 21/687* (2006.01)
*H01L 21/67* (2006.01)
(Continued)

(52) U.S. Cl.
CPC .. *H01L 21/68764* (2013.01); *H01L 21/67046* (2013.01); *H01L 21/67051* (2013.01); *H01L 21/67178* (2013.01); *H01L 21/67718* (2013.01); *H01L 21/68* (2013.01); *H01L 21/68707* (2013.01); *H01L 21/68721* (2013.01); *H01L 21/68728* (2013.01); *H01L 21/68771* (2013.01)

(58) Field of Classification Search
None
See application file for complete search history.

(56) References Cited

U.S. PATENT DOCUMENTS

2009/0067959 A1  3/2009  Takahashi et al. ...... 414/226.01
2013/0051967 A1  2/2013  Muramoto .................... 414/758
(Continued)

FOREIGN PATENT DOCUMENTS

JP        06-087531 A     3/1994
JP        2014-003080     1/2014
(Continued)

OTHER PUBLICATIONS

Notification of Reason for Refusal dated Jan. 29, 2020 in corresponding Korean Patent Application No. 10-2018-0085502.

*Primary Examiner* — Eric W Golightly
(74) *Attorney, Agent, or Firm* — Ostrolenk Faber LLP

(57) ABSTRACT

A pair of guide parts of a substrate inverting device comes in contact with the peripheral edge portion of a substrate on both sides in the width direction of the substrate. The switching mechanism changes a state of contact between the pair of guide parts and the substrate by switching the positions of the pair of guide parts between a first contact position and a second contact position. Each of the pair of guide parts has a first contact region and a second contact region. The second contact region is located at a position different in the up-down direction and the width direction from the position of the first contact region. The substrate inverting device is capable of switching regions of the guide parts that come in contact with the substrate between the first contact regions and the second contact regions in accordance with the state of the substrate.

10 Claims, 14 Drawing Sheets

(51) Int. Cl.
*H01L 21/68* (2006.01)
*H01L 21/677* (2006.01)

(56) References Cited

U.S. PATENT DOCUMENTS

2013/0333731 A1 12/2013 Kato .............................. 134/32
2015/0131088 A1 5/2015 Shinohara et al.

FOREIGN PATENT DOCUMENTS

| TW | 200739794 | | 10/2007 |
| TW | 201310565 | A1 | 3/2013 |
| TW | 201401405 | A1 | 1/2014 |

SUBSTRATE INVERTING DEVICE, SUBSTRATE PROCESSING APPARATUS, AND SUBSTRATE SUPPORTING DEVICE, AND SUBSTRATE INVERTING METHOD, SUBSTRATE PROCESSING METHOD, AND SUBSTRATE SUPPORTING METHOD

TECHNICAL FIELD

The present invention relates to a substrate inverting device, a substrate processing apparatus, and a substrate supporting device and to a substrate inverting method, a substrate processing method, and a substrate supporting method.

BACKGROUND ART

A process of manufacturing semiconductor substrates (hereinafter, simply referred to as "substrates") conventionally involves various types of processing that is performed on substrates. For example, the substrate processing apparatus disclosed in Japanese Patent Application Laid-Open No. 2014-3080 (Document 1) performs scrub cleaning processing on the back surfaces of substrates and then performs scrub cleaning processing on the front surfaces of the substrates. In the substrate processing apparatus, substrates with their front surfaces facing upward are transported into an indexer cell and turned upside down by an inversion/passing part, and then cleaning processing is performed on the back surfaces of the substrates. The substrates that have undergone the back-surface cleaning processing are turned upside down by an inversion part disposed above the inversion/passing part, and then cleaning processing is performed on the front surfaces of the substrates. The substrates that have undergone the cleaning processing are placed on an placement part disposed between the inversion/passing part and the inversion part and transported out to the indexer cell. The inversion/passing part includes a substrate inverting device in which substrates are supported in a horizontal posture by a supporting mechanism, and the substrates supported by the supporting mechanism are caught and held and inverted by a catch-and-hold inversion mechanism. The supporting mechanism supports substrates in a horizontal posture by bringing horizontal surfaces of its four support members into contact with the lower surfaces of the substrates.

In the substrate processing apparatus of Document 1, the inversion/passing part for inverting unprocessed substrates and the inversion part for inverting cleaned and processed substrates are provided separately. This configuration may increase the size of the substrate processing apparatus. On the other hand, if one and the same substrate inverting device is used to invert substrates irrespective of the state (e.g., unprocessed or processed) of the substrates, grime, particles, or the like on unprocessed substrates may adhere to the support members (i.e., guide parts) for supporting substrates in the substrate inverting device and be transferred to processed substrates.

SUMMARY OF INVENTION

The present invention is intended for a substrate inverting device, and it is an object of the present invention to switch a region of contact of each guide part with a substrate in accordance with the state of the substrate.

A substrate inverting device according to a preferable mode of the present invention includes a supporting mechanism coming in contact with a peripheral edge portion of a substrate in a horizontal posture and supporting the substrate from below, a catch-and-hold inversion mechanism catching and holding the substrate supported by the supporting mechanism and inverting the substrate. The supporting mechanism includes a pair of guide parts that comes in contact with the peripheral edge portion of the substrate on both sides in a width direction of the substrate, a guide moving mechanism advancing and retracting the pair of guide parts between a contact position at which the pair of guide parts comes in contact with the substrate and a retracted position that is farther away from the substrate than the contact position, and a switching mechanism changing a state of contact between the pair of guide parts and the substrate by switching positions of the pair of guide parts positioned at the contact position between a first contact position and a second contact position. Each of the pair of guide parts has a first contact region that comes in contact with the peripheral edge portion of the substrate at the first contact position, and a second contact region that is located at a position different in an up-down direction and the width direction from a position of the first contact region and comes in contact with the peripheral edge portion of the substrate at the second contact position. The substrate inverting device can switch the regions of contact of the guide parts with the substrate in accordance with the state of the substrate.

Preferably, the second contact region of each of the pair of guide parts is located below and inward in the width direction of the first contact region. The switching mechanism switches the positions of the pair of guide parts between the first contact position and the second contact position by changing a distance in the width direction between the pair of guide parts.

Preferably, the second contact region of one guide part, out of the pair of guide parts, is located below and inward in the width direction of the first contact region. The second contact region of the other guide part, out of the pair of guide parts, is located above and outward in the width direction of the first contact region. The switching mechanism switches the positions of the pair of guide parts between the first contact position at which the first contact regions of the pair of guide parts are positioned at the same position in the up-down direction and the second contact position at which the second contact regions of the pair of guide parts are positioned at the same position in the up-down direction, by rotating the pair of guide parts about a rotation axis extending in a horizontal direction.

Preferably, the second contact region of one guide part, out of the pair of guide parts, is located below and inward in the width direction of the first contact region. The second contact region of the other guide part, out of the pair of guide parts, is located above and outward in the width direction of the first contact region. The switching mechanism switches the positions of the pair of guide parts between the first contact position at which the first contact regions of the pair of guide parts are positioned at the same position in the up-down direction and the second contact position at which the second contact regions of the pair of guide parts are positioned at the same position in the up-down direction, by moving the other guide part relative to the one guide part in the up-down direction.

Preferably, a direction in which each guide part is moved by the guide moving mechanism is inclined relative to the up-down direction and the width direction.

Preferably, the switching mechanism switches the positions of the pair of guide parts between the first contact position and the second contact position by moving the pair of guide parts together with the guide moving mechanism.

Preferably, the first contact region and the second contact regions of each of the pair of guide parts are contact surfaces facing upward and are connected in stepwise form.

The present invention is also intended for a substrate processing apparatus. A substrate processing apparatus according to a preferable mode of the present invention includes the substrate inverting device described above, a back-surface cleaning processing part cleaning a back surface of a substrate inverted by the substrate inverting device, and a substrate transporter transporting the substrate between the substrate inverting device and the back-surface cleaning processing part.

Preferably, the substrate processing apparatus further includes a cleaning processing block in which the back-surface cleaning processing part and the substrate transporter are disposed, and an indexer block in which another substrate transporter is disposed and that passes an unprocessed substrate to the cleaning processing block and receives a processed substrate from the cleaning processing block. The substrate inverting device is disposed at a connection between the cleaning processing block and the indexer block. In a case where one transporter out of the substrate transporter and the another substrate transporter transports a substrate into the substrate inverting device, the substrate is inverted by the substrate inverting device and transported out of the substrate inverting device by the other substrate transporter.

The present invention is also intended for a substrate supporting device. A substrate supporting device according to a preferable mode of the present invention includes a pair of guide parts coming in contact with a peripheral edge portion of a substrate in a horizontal posture on both sides in a width direction of the substrate and supporting the substrate from below, and a switching mechanism changing a state of contact between the pair of guide parts and the substrate by switching positions of the pair of guide parts between a first contact position and a second contact position. Each of the pair of guide parts has a first contact region that comes in contact with the peripheral edge portion of the substrate at the first contact position, and a second contact region that is located at a position different in an up-down direction and the width direction from a position of the first contact region and comes in contact with the peripheral edge portion of the substrate at the second contact position.

The present invention is also intended for a substrate inverting method of inverting a substrate by a substrate inverting device that includes a pair of guide parts and a catch-and-hold inversion mechanism, the pair of guide parts each having a first contact region that comes in contact with a peripheral edge portion of a substrate and a second contact region that is located at a position different in an up-down direction and a width direction of the substrate from a position of the first contact region and comes in contact with the peripheral edge portion of the substrate, and the catch-and-hold inversion mechanism being a mechanism for catching and holding the substrate supported by the pair of guide parts and inverting the substrate.

A substrate inverting method according to a preferable mode of the present invention includes a) transporting the substrate into the substrate inverting device, b) supporting the substrate from below by bringing the first contact regions of the pair of guide parts positioned at a first contact position on both sides in the width direction of the substrate into contact with the peripheral edge portion of the substrate in a horizontal posture, c) catching and holding the substrate by the catch-and-hold inversion mechanism, retracting the pair of guide parts to a retracted position, and inverting the substrate by the catch-and-hold inversion mechanism, d) transporting the substrate out of the substrate inverting device, e) transporting the substrate into the substrate inverting device, f) supporting the substrate from below by bringing the second contact regions of the pair of guide parts positioned at a second contact position different from the first contact position into contact with the peripheral edge portion of the substrate in a horizontal posture, g) catching and holding the substrate by the catch-and-hold inversion mechanism, retracting the pair of guide parts to a retracted position, and inverting the substrate by the catch-and-hold inversion mechanism, and h) transporting the substrate out of the substrate inverting device. The substrate inverting method allows the regions of contact of the guide parts with the substrate to be switched in accordance with the state of the substrate.

The present invention is also intended for a substrate processing method. A substrate processing method according to a preferable mode of the present invention includes the substrate inverting method described above and a back-surface cleaning processing step of cleaning the back surface of the substrate between the operation d) and the operation e).

The present invention is also intended for a substrate supporting method of supporting a substrate by a substrate supporting device that includes that includes a pair of guide parts having a first contact region that comes in contact with a peripheral edge portion of the substrate and a second contact region that is located at a position different in an up-down direction and a width direction from a position of the first contact region and comes in contact with the peripheral edge portion of the substrate. A substrate supporting method according to a preferable mode of the present invention includes a) transporting the substrate into the substrate supporting device, b) supporting the substrate from below by bringing the first contact regions of the pair of guide parts positioned at a first contact position on both sides in a width direction of the substrate into contact with the peripheral edge portion of the substrate in a horizontal posture, c) transporting the substrate out of the substrate supporting device, d) transporting the substrate into the substrate supporting device, e) supporting the substrate from below by bringing the second contact regions of the pair of guide parts positioned at a second contact position different from the first contact position into contact with the peripheral edge portion of the substrate in a horizontal posture, and f) transporting the substrate out of the substrate supporting device.

These and other objects, features, aspects and advantages of the present invention will become more apparent from the following detailed description of the present invention when taken in conjunction with the accompanying drawings.

DESCRIPTION OF EMBODIMENTS

Figure 1:
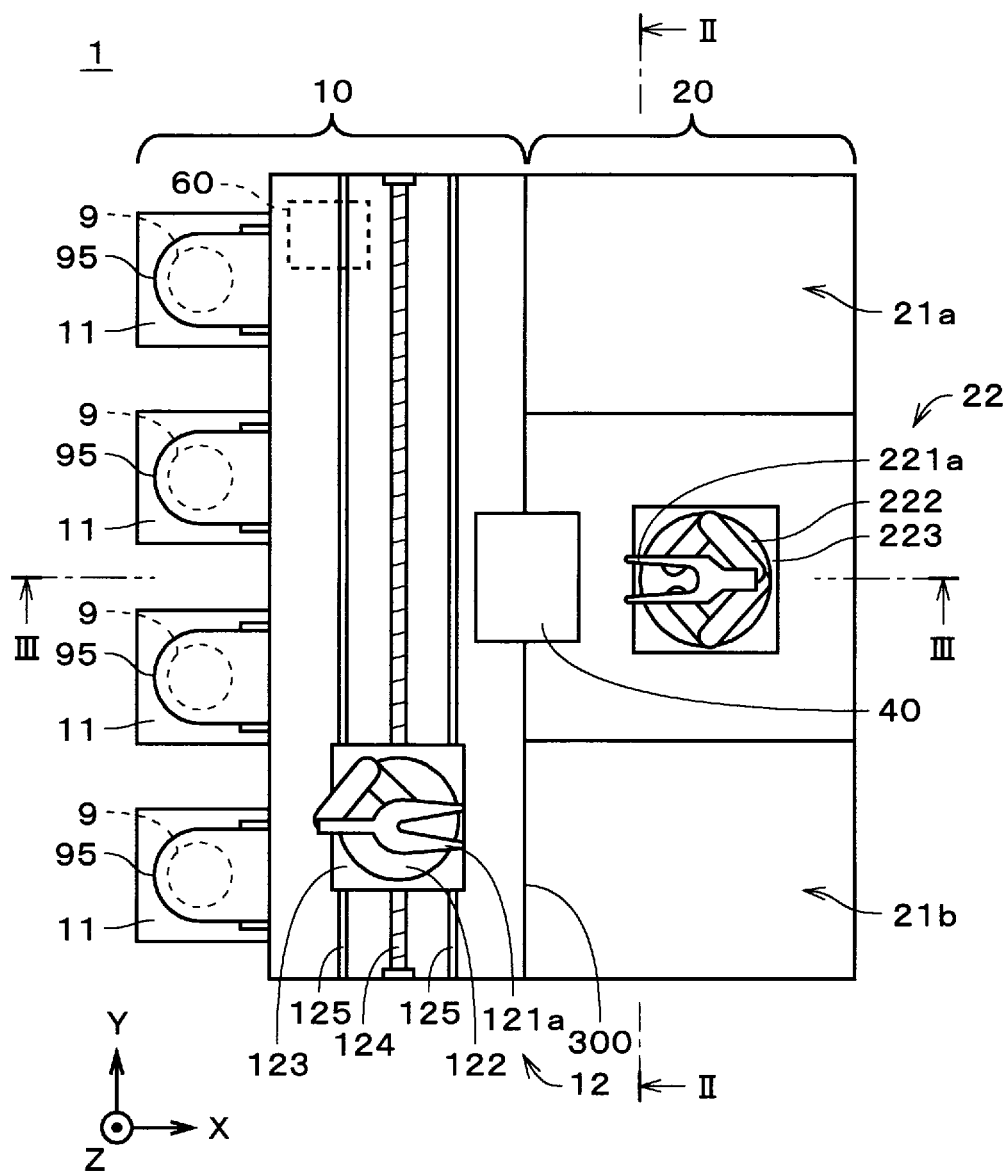
FIG. 1 is a plan view of a substrate processing apparatus according to an embodiment.
Figure 2:
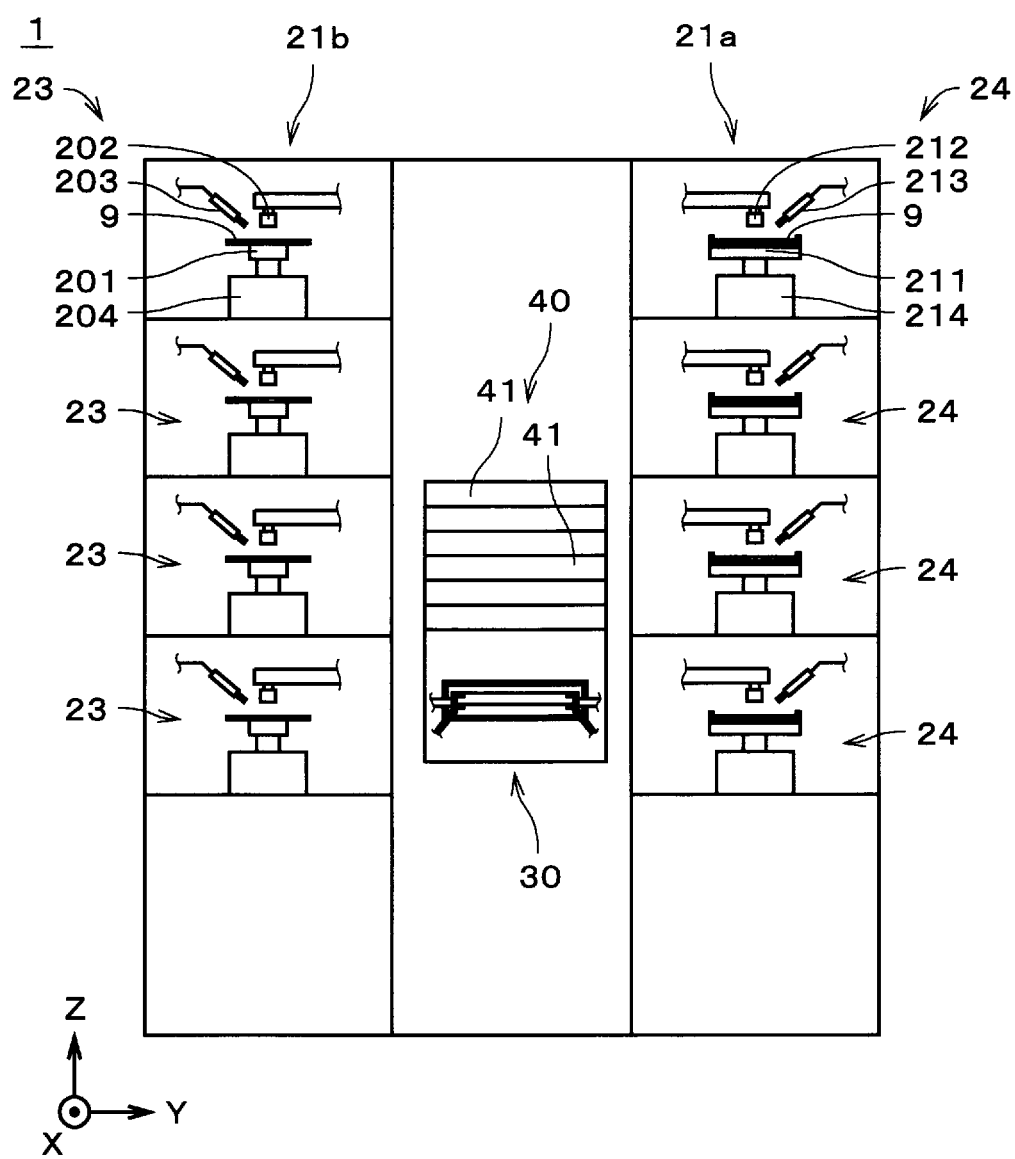
FIG. 2 is a view of the substrate processing apparatus taken along line II-II.
Figure 3:
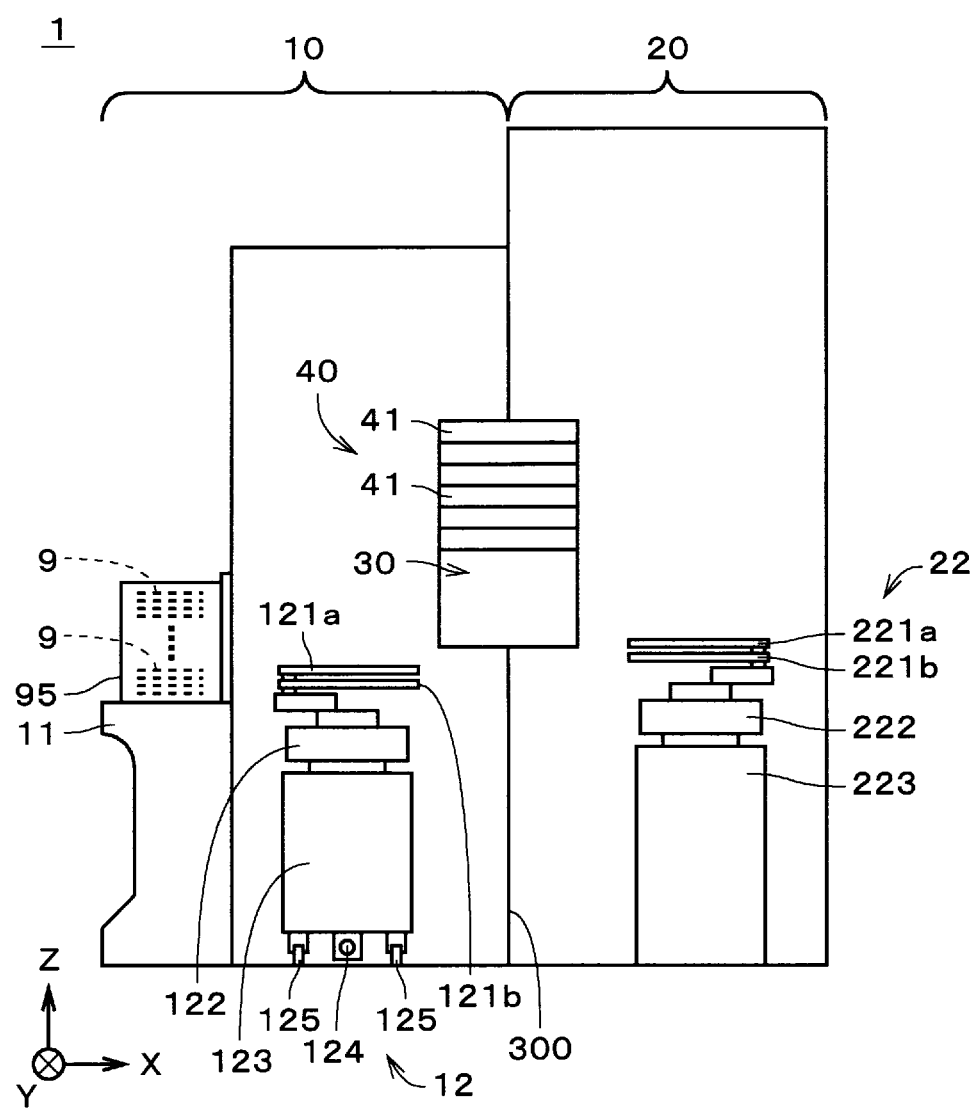
FIG. 3 is a view of the substrate processing apparatus taken along line III-III.
Figure 4:
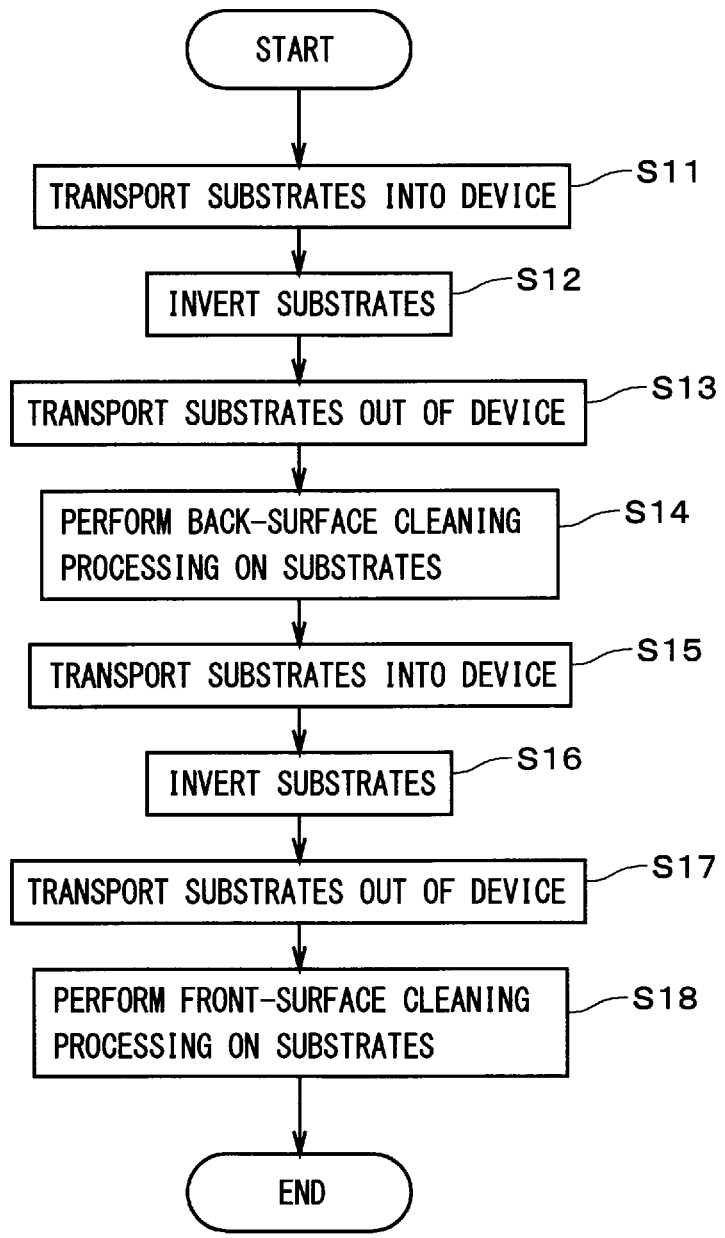
FIG. 4 is a flowchart of substrate processing.

FIG. 1 is a plan view of a substrate processing apparatus 1 according to an embodiment of the present invention. FIG. 2 is a view of the substrate processing apparatus 1 taken along line II-II in FIG. 1. FIG. 3 is a view of the substrate processing apparatus 1 taken along line III-III in FIG. 1. Note that an XYZ orthogonal coordinate system in which the Z axial direction is the vertical direction (i.e., up-down direction) and an XY plane is a horizontal plane is appropriately given to each drawing referenced below.

The substrate processing apparatus 1 is an apparatus for performing processing continuously on a plurality of semiconductor substrates 9 (hereinafter, simply referred to as "substrates 9"). The substrate processing apparatus 1 performs, for example, cleaning processing on the substrates 9. The substrate processing apparatus 1 includes an indexer block 10 and a cleaning processing block 20. In the following description, the indexer block 10 and the cleaning processing block 20 are respectively referred to as an indexer cell 10 and a cleaning processing cell 20. The indexer cell 10 and the cleaning processing cell 20 are arranged adjacent to each other in the X direction.

The substrate processing apparatus 1 further includes an inversion unit 30, a placement unit 40, and a controller 60. The inversion unit 30 and the placement unit 40 are disposed at a connection between the indexer cell 10 and the cleaning processing cell 20. Specifically, the inversion unit 30 and the placement unit 40 are provided through part of a partition wall 300 that is provided for interrupting atmospheres between the indexer cell 10 and the cleaning processing cell 20. The controller 60 controls and causes operating mechanisms such as the indexer cell 10, the cleaning processing cell 20, and the inversion unit 30 to execute processing for cleaning the substrates 9. The controller 60 is, for example, a general computer system that includes, for example, a CPU that performs various types of arithmetic processing, a ROM that stores basic programs, and a RAM that stores various types of information.

The indexer cell 10 receives substrates 9 that are transported from outside into the substrate processing apparatus 1 (i.e., unprocessed substrates before being processed by the cleaning processing cell 20) and passes the substrates 9 to the cleaning processing cell 20. The indexer cell 10 also receives substrates 9 that are transported out of the cleaning processing cell 20 (i.e., processed substrates that have undergone the processing performed by the cleaning processing cell 20) and transports the substrates 9 out of the substrate processing apparatus 1. The indexer cell 10 includes a plurality of (e.g., four) carrier stages 11 and a transfer robot 12. Each carrier stage 11 has placed thereon a carrier 95 that can house a plurality of disc-like substrates 9. The transfer robot 12 serves as a substrate transporter that takes unprocessed substrates 9 out of each carrier 95 and houses processed substrates 9 in each carrier 95.

Referring to each carrier stage 11, a carrier 95 that houses a plurality of unprocessed substrates 9 is transported from outside into the substrate processing apparatus 1 by, for example, an automatic guided vehicle (AGV) and placed on the carrier stage 11. Processed substrates 9 that have undergone the cleaning processing performed by the cleaning processing cell 20 are housed again in the carrier 95 placed on the carrier stage 11. The carrier 95 housing the processed substrates 9 is transported out of the substrate processing apparatus 1 by, for example, an AGV. That is, the carrier stage 11 functions as a substrate accumulation part for accumulating unprocessed and processed substrates 9. The carrier 95 is, for example, a front opening unified pod (FOUP) that houses substrates 9 in an enclosed space. The carrier 95 is not limited to the FOUP, and may, for example, be a standard mechanical interface (SMIF) pod, or an open cassette (OC) that exposes housed substrates 9 to outside air.

The transfer robot 12 includes two transport arms 121a and 121b, an arm stage 122, and a movable mount 123. The two transport arms 121a and 121b are mounted on the arm stage 122. The movable mount 123 has threaded engagement with a ball screw 124 that extends in parallel with the direction of arrangement of the plurality of carrier stages 11 (i.e., Y direction) and is provided slidably along two guide rails 125. When the ball screw 124 is rotated by a rotary motor (not shown), the transfer robot 12 in its entirety including the movable mount 123 is moved horizontally in the Y direction.

The arm stage 122 is mounted on the movable mount 123. The movable mount 123 includes a built-in motor (not shown) that rotates the arm stage 122 about a rotation axis extending in the up-down direction (i.e., Z direction) and a built-in motor (not shown) that moves the arm stage 122 in the up-down direction. The transport arms 121a and 121b are disposed away from each other in the up-down direction on the arm stage 122. The transport arms 121a and 121b each have a forked shape in plan view. Each of the transport arms 121a and 121b supports the lower surface of a single substrate 9 with its forked portion. Also, the articulated structures of the transport arms 121a and 121b are expanded and contracted by a drive mechanism (not shown) built in the arm stage 122, so that the transport arms 121a and 121b are moved independently of each other in a horizontal direction (i.e., a radial direction centered on the rotation axis of the arm stage 122).

The transfer robot 12 transports substrates 9 among the carriers 95, the inversion unit 30, and the placement unit 40 by causing each of the transport arms 121a and 121b that support the substrates 9 with their forked portions to individually access the carriers 95 placed on the carrier stages 11, the inversion unit 30, and the placement unit 40.

The cleaning processing cell 20 is, for example, a cell (i.e., processing block) that performs scrub cleaning processing on substrates 9. The cleaning processing cell 20 includes two cleaning processing units 21a and 21b and a transport robot 22. The transport robot 22 serves as a substrate transporter that receives and passes substrates 9 from and to the inversion unit 30, the placement unit 40, and the cleaning processing units 21a and 21b.

The cleaning processing units 21a and 21b oppose each other in the Y direction with the transport robot 22 therebetween. The cleaning processing unit 21b on the −Y side of the transport robot 22 includes one or more front-surface cleaning processing parts 23. The cleaning processing unit 21b illustrated in FIG. 2 includes four front-surface cleaning processing parts 23 stacked one above another in the up-down direction. The cleaning processing unit 21a on the +Y side of the transport robot 22 includes one or more back-surface cleaning processing parts 24. The cleaning processing unit 21a illustrated in FIG. 2 includes four back-surface cleaning processing parts 24 stacked one above another in the up-down direction.

The front-surface cleaning processing parts 23 perform scrub cleaning processing on substrates 9. The "front surface" of a substrate 9 as used herein refers to, out of the two main surfaces of the substrate 9, one main surface on which a pattern (e.g., circuit pattern) is formed. The "back surface" of a substrate 9 as used herein refers to the opposite main surface of the front surface of the substrate 9. The front-surface cleaning processing parts 23 each include, for example, a spin chuck 201, a cleaning brush 202, a nozzle 203, and a spin motor 204. The spin chuck 201 holds a substrate 9 in a horizontal posture with the front surface facing upward, and rotates the substrate 9 about a rotation axis extending in the up-down direction. The spin chuck 201 holds the substrate 9 by, for example, adsorbing the back surface of the substrate 9. The cleaning brush 202 comes in contact with or close proximity to the front surface of the substrate 9 held on the spin chuck 201 and performs scrub cleaning on the front surface of the substrate 9. The nozzle 203 ejects a cleaning liquid (e.g., deionized water) to the front surface of the substrate 9. The spin motor 204 rotates the substrate 9 together with the spin chuck 201. The cleaning liquid dispersed from the rotating substrate 9 to the surroundings is received by a cup part (not shown) that surrounds the substrate 9.

The back-surface cleaning processing parts 24 perform scrub cleaning processing on the back surfaces of substrates 9. The back-surface cleaning processing parts 24 each include, for example, a spin chuck 211, a cleaning brush 212, a nozzle 213, and a spin motor 214. The spin chuck 211 holds a substrate 9 in a horizontal posture with the back surface facing upward, and rotates the substrate 9 about a rotation axis extending in the up-down direction. The spin chuck 211 holds the substrate 9 by, for example, mechanically catching and holding the edge portion of the substrate 9. The cleaning brush 212 comes in contact with or close proximity to the back surface of the substrate 9 held on the spin chuck 211 and performs scrub cleaning on the back surface of the substrate 9. The nozzle 213 ejects a cleaning liquid (e.g., deionized water) to the back surface of the substrate 9. The spin motor 214 rotates the substrate 9 together with the spin chuck 211. The cleaning liquid dispersed from the rotating substrate 9 to the surroundings is received by a cup part (not shown) that surrounds the substrate 9.

The transport robot 22 includes two transport arms 221a and 221b, an arm stage 222, and a mount 223. The two transport arms 221a and 221b are mounted on the arm stage 222. The mount 223 is fixed to the frame of the cleaning processing cell 20. Thus, the mount 223 of the transport robot 22 does not move in the horizontal direction and the up-down direction.

The arm stage 222 is mounted on the mount 223. The mount 223 includes a built-in motor (not shown) that rotates the arm stage 222 about a rotation axis extending in the up-down direction, and a built-in motor (not shown) that moves the arm stage 222 in the up-down direction. The transport arms 221a and 221b are disposed away from each other in the up-down direction on the arm stage 222. The transport arms 221a and 221b each have a forked shape in plan view. Each of the transport arms 221a and 221b supports the lower surface of a single substrate 9 with its forked portion. Also, the articulated structure of each transport arm 221a or 221b is expanded and contracted by a drive mechanism (not shown) built in the arm stage 222, so that the transport arms 221a and 221b are moved independently of each other in a horizontal direction (i.e., a radial direction centered on the rotation axis of the arm stage 222).

The transport robot 22 transports substrates 9 among the cleaning processing units 21a and 21b, the inversion unit 30, and the placement unit 40 by causing each of the transport arms 221a and 221b that support the substrates 9 with their forked portions to access the cleaning processing units 21a and 21b, the inversion unit 30, and the placement unit 40. Note that other mechanisms such as a belt transport mechanism using a pulley and a timing belt may be employed as the up-down movement mechanism of the transport robot 22.

The inversion unit 30 inverts unprocessed substrates 9 received from the indexer cell 10 upside down (i.e., inverts the front and back surfaces of unprocessed substrates 9 by 180 degrees) and then passes the unprocessed substrates 9 to the cleaning processing cell 20. The inversion unit 30 inverts processed substrates 9 received from the cleaning processing cell 20 upside down (i.e., inverts the front and back surfaces of processed substrates 9 by 180 degrees) and then passes the processed substrates 9 to the indexer cell 10 or the cleaning processing cell 20. That is, the inversion unit 30 has both a function as an inversion part for inverting substrates 9 and a function as a part for receiving and passing substrates 9 between the transfer robot 12 and the transport robot 22. The structure of the inversion unit 30 will be described later.

The placement unit 40 is disposed above the inversion unit 30. The placement unit 40 and the inversion unit 30 may be in contact with each other in the up-down direction or may be spaced from each other in the up-down direction. The placement unit 40 is used to receive and pass substrates 9 between the indexer cell 10 and the cleaning processing cell 20. The placement unit 40 includes one or more placement parts 41. The placement unit 40 illustrated in FIGS. 2 and 3 includes six placement parts 41 stacked one above another in the up-down direction. Each placement part 41 supports a single substrate 9 in a horizontal posture. For example, among the six placement parts 41 of the placement unit 40, the upper three placement parts 41 are used to receive and pass processed substrates 9 from the cleaning processing cell 20 to the indexer cell 10, and the lower three placement parts 41 are used to receive and pass unprocessed substrates 9 from, for example, the indexer cell 10 to the cleaning processing cell 20.

Next, one example of the flow of processing performed on substrates 9 by the substrate processing apparatus 1 will be described. The substrate processing apparatus 1 performs processing on substrates 9 in accordance with a procedure (so-called flow) for transporting substrates 9 and a recipe that describes processing conditions for substrates 9. The following is a description of a case where the both surfaces (i.e., front and back surfaces) of substrates 9 are cleaned.

First, a carrier 95 that houses unprocessed substrates 9 is transported from outside the substrate processing apparatus 1 into a carrier stage 11 of the indexer cell 10 by, for example, an AGV. Then, the transfer robot 12 of the indexer cell 10 takes two unprocessed substrates 9 out of the carrier 95 and transports these two substrates 9 into the inversion unit 30 by using the transport arms 121*a* and 121*b* (step S11). The substrates 9 are transported into the inversion unit 30, with their front surfaces facing upward. In the inversion unit 30, a substrate inverting device 100 inverts the front and back of the two substrates 9 so that each substrate 9 has its back surface facing upward (step S12). The operations of the substrate inverting device 100 will be described later.

When the two substrates 9 have been inverted by the inversion unit 30, the transport robot 22 of the cleaning processing cell 20 receives the two substrates 9 (i.e., two substrates 9 with their back surfaces facing upward) from the inversion unit 30 by using the transport arms 221*a* and 221*b*. That is, the substrates 9 are transported out of the inversion unit 30 (step S13). The transport robot 22 transports the two substrates 9 respectively to arbitrary two back-surface cleaning processing parts 24 among the four back-surface cleaning processing parts 24.

The back-surface cleaning processing parts 24 in which the substrates 9 have been transported perform back-surface cleaning processing on the substrates 9 (step S14). Specifically, in the back-surface cleaning processing parts 24, a cleaning liquid is supplied from the nozzle 213 to the back surface of the substrate 9 while the substrate 9 with its back surface facing upward is held and being rotated by the spin chuck 211. In this state, the cleaning brush 212 comes in contact with or close proximity to the back surface of the substrate 9 and performs a scan in a horizontal direction, so that scrub cleaning processing is performed on the back surface of the substrate 9.

When the back-surface cleaning processing parts 24 have finished the processing for cleaning the back surfaces of the substrates 9, the transport robot 22 successively takes the two substrates 9, which have undergone the back-surface cleaning processing, out of the two back-surface cleaning processing parts 24 and transports the two substrates 9 into the inversion unit 30 by using the transport arms 221*a* and 221*b* (step S15). The substrates 9 are transported into the inversion unit 30, with their back surfaces facing upward. In the inversion unit 30, the substrate inverting device 100 inverts the front and back of the two substrates 9 so that each substrate 9 has its front surface facing upward (step S16).

When the two substrates 9 have been inverted by the inversion unit 30, the transport robot 22 of the cleaning processing cell 20 receives the two substrates 9 (i.e., two substrates 9 with their front surfaces facing upward) from the inversion unit 30 by using the transport arms 221*a* and 221*b*. That is, the substrates 9 are transported out of the inversion unit 30 (step S17). The transport robot 22 transports the two substrates 9 respectively to arbitrary two front-surface cleaning processing parts 23 among the four front-surface cleaning processing parts 23.

The front-surface cleaning processing parts 23 in which the substrates 9 have been transported perform front-surface cleaning processing on the substrates 9 (step S18). Specifically, in the front-surface cleaning processing parts 23, a cleaning liquid is supplied from the nozzle 203 to the front surface of the substrate 9 while the substrate 9 with its front surface facing upward is held and being rotated by the spin chuck 201. In this state, the cleaning brush 202 comes in contact with or close proximity to the front surface of the substrate 9 and performs a scan in a horizontal direction, so that scrub cleaning processing is performed on the front surface of the substrate 9.

When the front-surface cleaning processing parts 23 have finished the processing for cleaning the front surfaces of the substrates 9, the transport robot 22 successively takes the two substrates 9 (i.e., processed substrates 9), which have undergone the front-surface cleaning processing, out of the two front-surface cleaning processing parts 23 and transports the two substrates 9 into two placement parts 41 of the placement unit 40 by using the transport arms 221*a* and 221*b*. The substrates 9 are supported by the placement parts 41, with their front surfaces facing upward. Then, the transfer robot 12 of the indexer cell 10 takes out the two processed substrates 9 and houses the substrates 9 in the carrier 95 by using the transport arms 121*a* and 121*b*.

As described above, in the substrate processing apparatus 1, the substrate inverting device 100 can invert the front and back of substrates 9 when the substrates 9 are received and passed between the transfer robot 12 provided in the indexer cell 10 and the transport robot 22 provided in the cleaning processing cell 20. That is, the substrate inverting device 100 has not only a function of inverting substrates 9 but also a function as a part for receiving and passing substrates 9 between the transfer robot 12 and the transport robot 22. This configuration reduces the load on the transport robot 22 and reduces the number of processing steps to be performed in the cleaning processing cell 20, as compared with the case where the part for receiving and passing substrates 9 and the inversion part are provided separately. As a result, it is possible to efficiently suppress a reduction in the throughput of the substrate processing apparatus 1. Also, the substrate inverting device 100 of the inversion unit 30 can appropriately invert two substrates 9 at one time, as will be described later. This further improves the throughput of the substrate processing apparatus 1.

Figure 5:
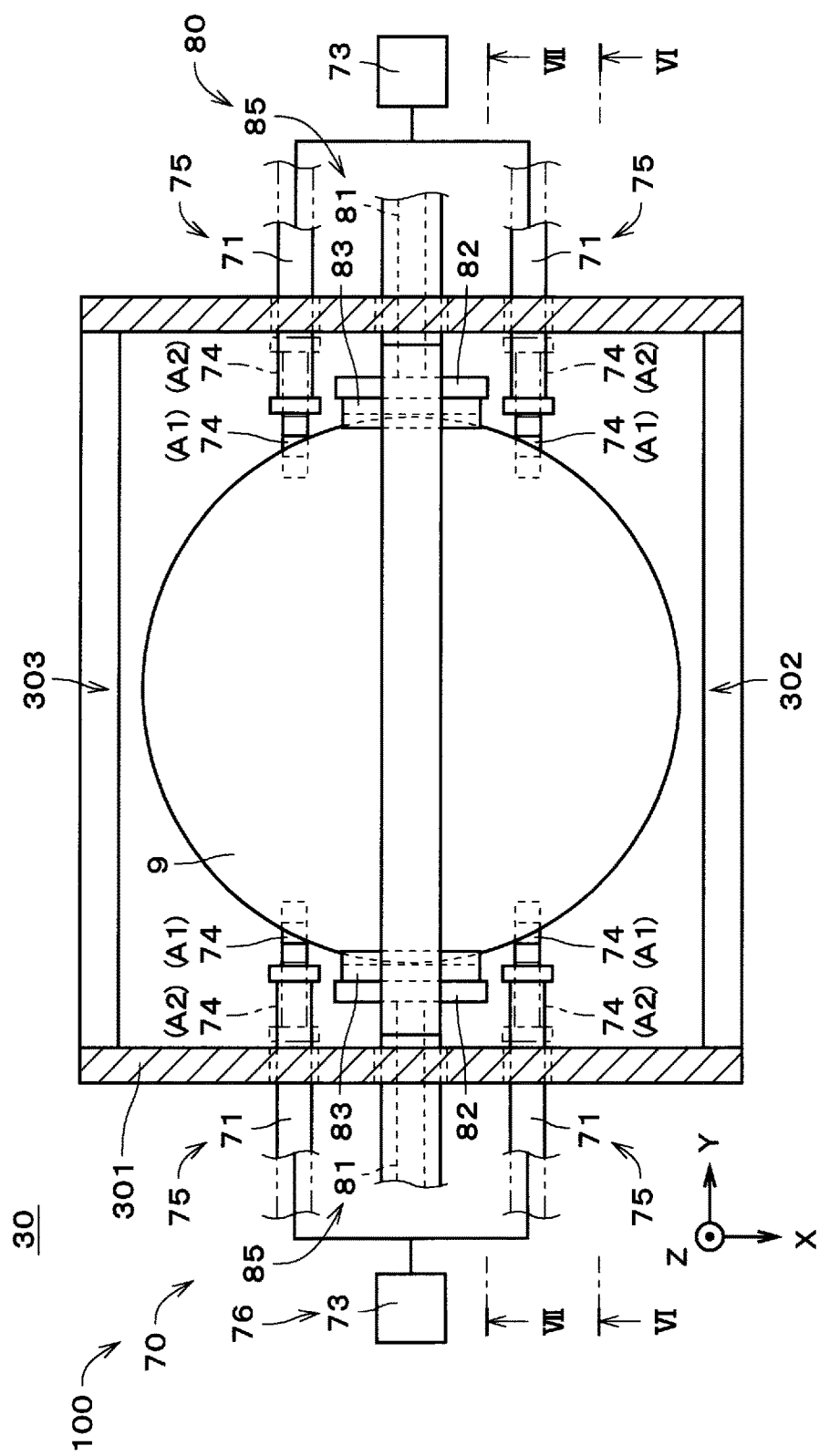
FIG. 5 is a plan view of an inversion unit.
Figure 6:
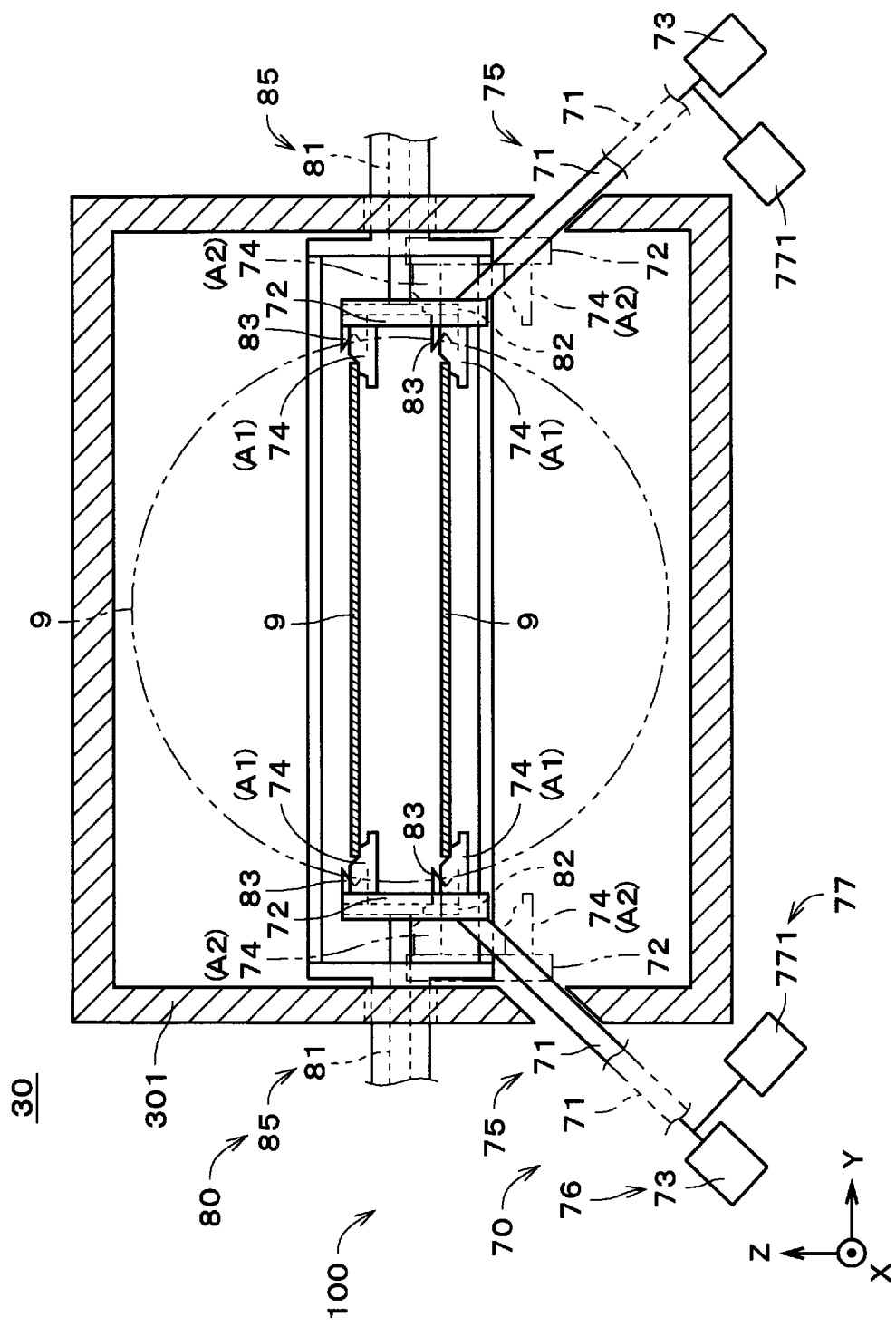
FIG. 6 is a view of the inversion unit taken along line VI-VI.
Figure 7:
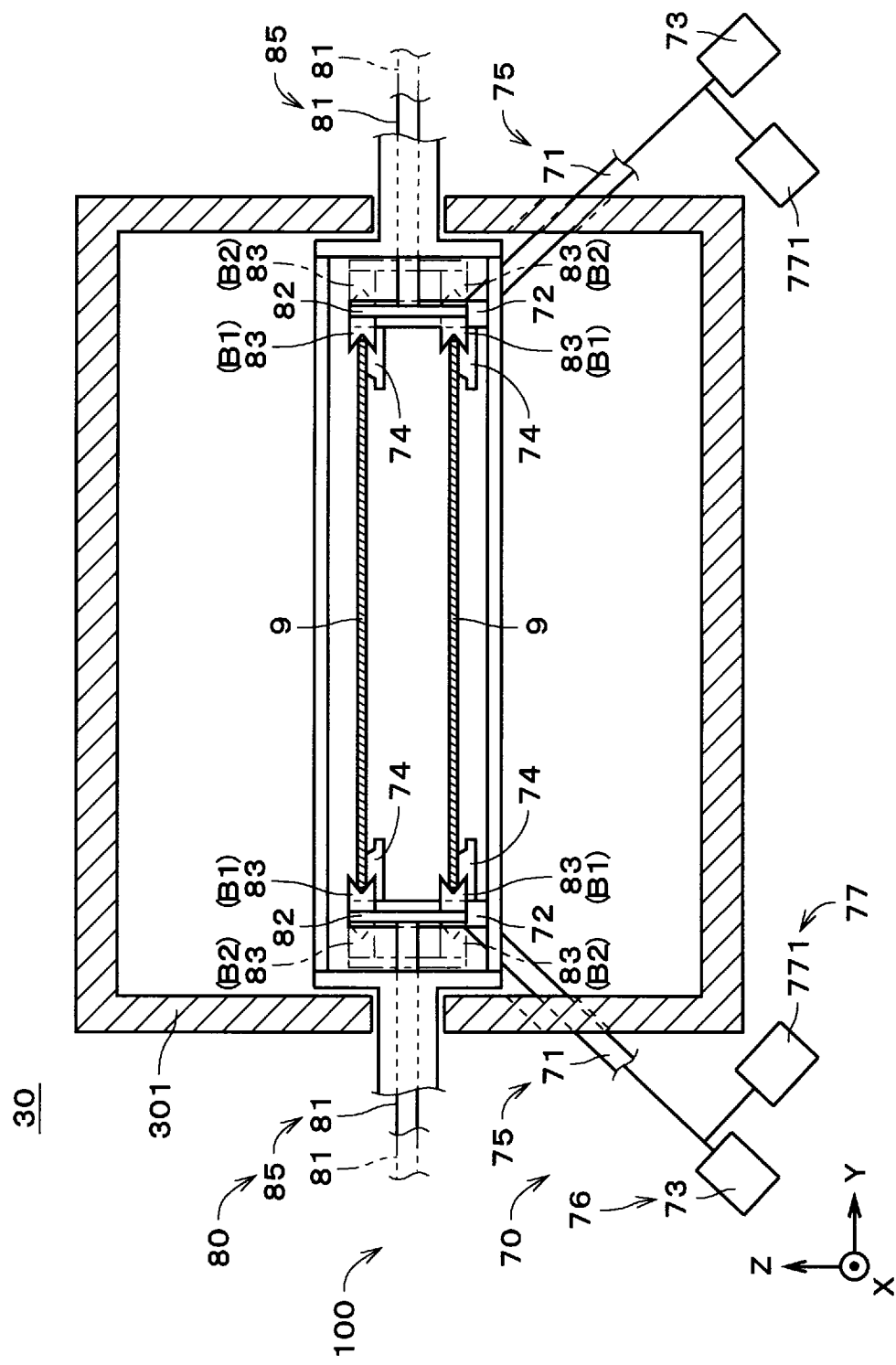
FIG. 7 is a view of the inversion unit taken along line VII-VII.

Next, the configuration of the inversion unit 30 will be described with reference to FIGS. 5 to 7. FIG. 5 is a plan view of the inversion unit 30. FIG. 6 is a view of the inversion unit 30 taken along line VI-VI in FIG. 5. FIG. 7 is a view of the inversion unit 30 taken along line VII-VII in FIG. 5.

The inversion unit 30 includes the substrate inverting device 100 and a casing 301. The casing 301 houses the substrate inverting device 100 therein. The substrate inverting device 100 includes a supporting mechanism 70 and a catch-and-hold inversion mechanism 80. The supporting mechanism 70 comes in contact with the peripheral edge portions of substrates 9 in a horizontal posture and supports the substrates 9 from below. The catch-and-hold inversion mechanism 80 catches and holds the substrates 9 supported by the supporting mechanism 70 and inverts the substrates 9. In the example illustrated in FIG. 6, the supporting mechanism 70 supports two substrates 9 that are spaced from each other in the up-down direction and stacked one above the other. The catch-and-hold inversion mechanism 80 inverts these two substrates 9 at one time. The supporting mechanism 70 may support one substrate 9, or may support three or more substrates 9. The catch-and-hold inversion mechanism 80 may catch and hold and invert the one or three or more substrates 9 at one time. In the casing 301, a detector (not shown) is also disposed. The detector detects whether the substrates 9 are properly supported by the supporting mechanism 70. The detector is, for example, an optical sensor that is disposed serval millimeters to several centimeters above the upper surfaces of the substrates 9.

The transfer robot 12 and the transport robot 22 (see FIG. 1) can access the inside of the casing 301. Out of the wall of the casing 301, a wall portion on the side close to the cleaning processing cell 20 (i.e., +X side) has an opening 302 for allowing the transport arms 221*a* and 221*b* of the transport robot 22 to access the inside of the casing 301. Also, out of the wall of the casing 301, a wall portion on the side close to the indexer cell 10 (i.e., −X side) has an opening 303 for allowing the transport arms 121*a* and 121*b* of the transfer robot 12 to access the inside of the casing 301. In the following description, the +X side where the opening 302 of the casing 301 is present is referred to as the "front side," and the −X side where the opening 303 is present is referred to as the "back side." The Y direction orthogonal to the back-and-forth direction (i.e., X direction) and the up-down direction (i.e., Z direction) is referred to as a "right-left direction." The right-left direction is also the width direction of the substrate inverting device 100.

The supporting mechanism 70 includes four supporters 75, a guide moving mechanism 76, and a switching mechanism 77. Each two of the four supporters 75 are disposed at approximately the same position in the up-down direction on each side in the right-left direction (i.e., width direction) of substrates 9 and support the substrates 9 from below. The two supporters 75 on the right side of the substrates 9 are disposed away from each other in the back-and-forth direction. The two supporters 75 on the left side of the substrates 9 are also disposed away from each other in the back-and-forth direction. Each supporter 75 includes an oblique shaft 71, a support strut 72, and two guide parts 74. The guide moving mechanism 76 includes a pair of cylinders 73 disposed on both right and left sides of the casing 301. The switching mechanism 77 includes a pair of switching drive parts 771 disposed on both right and left sides of the casing 301. The switching drive parts 771 are, for example, cylinders.

The oblique shaft 71 of each supporter 75 extends through a side wall in the right-left direction of the casing 301. The oblique shafts 71 are rod-like members that extend approximately linearly upward from the outside to the inside of the casing 301. The upper end portions of the oblique shafts 71 are located inside the casing 301. The upper end portions of the oblique shafts 71 are connected to the support struts 72 that extend in the up-down direction.

The guide parts 74 that extend widthwise inward (i.e., toward the center part of the casing 301) in the right-left direction are connected in a cantilever manner to the upper and lower end portions of the support struts 72. The details of the shape of the guide parts 74 will be described later. The four guide parts 74 that are connected to the upper end portions of the four support struts 72 are located at approximately the same position in the up-down direction and come in contact with the lower surface of the peripheral portion of the upper substrate 9. The four guide parts 74 that are connected to the lower end portions of the four support struts 72 are located at approximately the same position in the up-down direction and come in contact with the lower surface of the peripheral portion of the lower substrate 9. In the following description, the four guide parts 74 that come in contact with the lower surface of each substrate 9 and support the substrate 9 are collectively referred to as a "group of guide parts."

The four guide parts 74 in each group of guide parts are arranged approximately axisymmetrically with respect to the diameter of a substrate 9 that extends in the right-left direction. The two guide parts 74 that are located on the front side of the diameter of the substrate 9 are located at approximately the same position in the back-and-forth direction and oppose each other in the right-left direction with the substrate 9 therebetween. The two guide parts 74 that are located on the back side of the diameter of the substrate 9 are also located at approximately the same position in the back-and-forth direction and oppose each other in the right-left direction with the substrate 9 therebetween. In each group of guide parts, each two guide parts 74 that are located at approximately the same position in the back-and-forth direction and that oppose each other in the right-left direction are also referred to as a "pair of guide parts 74" in the following description.

The lower end portion of each oblique shaft 71 is located outside the casing 301. The lower end portions of the two oblique shafts 71 provided on the right side of the casing 301 are coupled to one of the cylinders 73 via a coupling rod (not shown) that extends in the back-and-forth direction. The direction in which the cylinder 73 advances and retracts is approximately parallel to the direction of extension of the oblique shafts 71. When the cylinder 73 is driven, the aforementioned two oblique shafts 71 are moved in synchronization in the direction of extension of the oblique shafts 71. The lower end portions of the two oblique shafts 71 provided on the left side of the casing 301 are coupled to the other cylinder 73 via a coupling rod (not shown) that extends in the back-and-forth direction. When this cylinder 73 is driven, the aforementioned two oblique shafts 71 are moved in synchronization in the direction of extension of the oblique shafts 71.

In the substrate inverting device 100, when the pair of cylinders 73 of the guide moving mechanism 76 is driven, each guide part 74 is moved together with the oblique shaft 71 from a support position A1 at which the guide part 74 supports a substrate 9 in contact with the substrate 9 to a retracted position A2 that is spaced from the substrate 9. In FIGS. 5 and 6, the guide parts 74 and other parts positioned at the retracted position A2 are indicated by dashed double-dotted lines. The retracted position A2 is located below and outward in the width direction (i.e., on the side away from the center of the substrate 9 in the right-left direction) of the support position A1. In other words, the guide parts 74 are moved obliquely downward from the support position A1 to the retracted position A2 and moved obliquely upward from the retracted position A2 to the support position A1. In yet other words, the guide parts 74 positioned at the support position A1 are moved in the direction away from the lower and side surfaces of the substrate 9 to the retracted position A2.

The retracted position A2 is set to a position that is located outward in the width direction of the peripheral edge of a substrate 9 (i.e., radially outward of the substrate 9) in plan view. Thus, the retracted position A2 is located outside a region (i.e., inversion region) where each substrate 9 passes through when being inverted by the catch-and-hold inversion mechanism 80. Accordingly, the guide parts 74 that are positioned at the retracted position A2 do not interfere with substrates 9 that are inverted. For example, the retracted position A2 of the upper guide parts 74 is set to be above the support position A1 of the lower guide parts 74.

As described above, the direction in which each guide part 74 is moved by the guide moving mechanism 76 is inclined relative to the up-down direction and the width direction. An angle formed by the direction of movement of each guide part 74 and a horizontal direction is appropriately set on the basis of, for example, the distance in the up-down direction between a plurality of substrates 9 supported by a plurality of groups of guide parts and the distance in the radial direction between the peripheral edges of the substrates 9 and the positions of contact between the guide parts 74 and the substrates 9. Although in the example illustrated in FIG. 5, each guide part 74 is moved in the Y direction in plan view, the guide part 74 may be moved in a radial direction that extends radially from the center of the substrate 9 in plan view (i.e., a direction inclined relative to the Y direction and the X direction in plan view).

Figure 8:
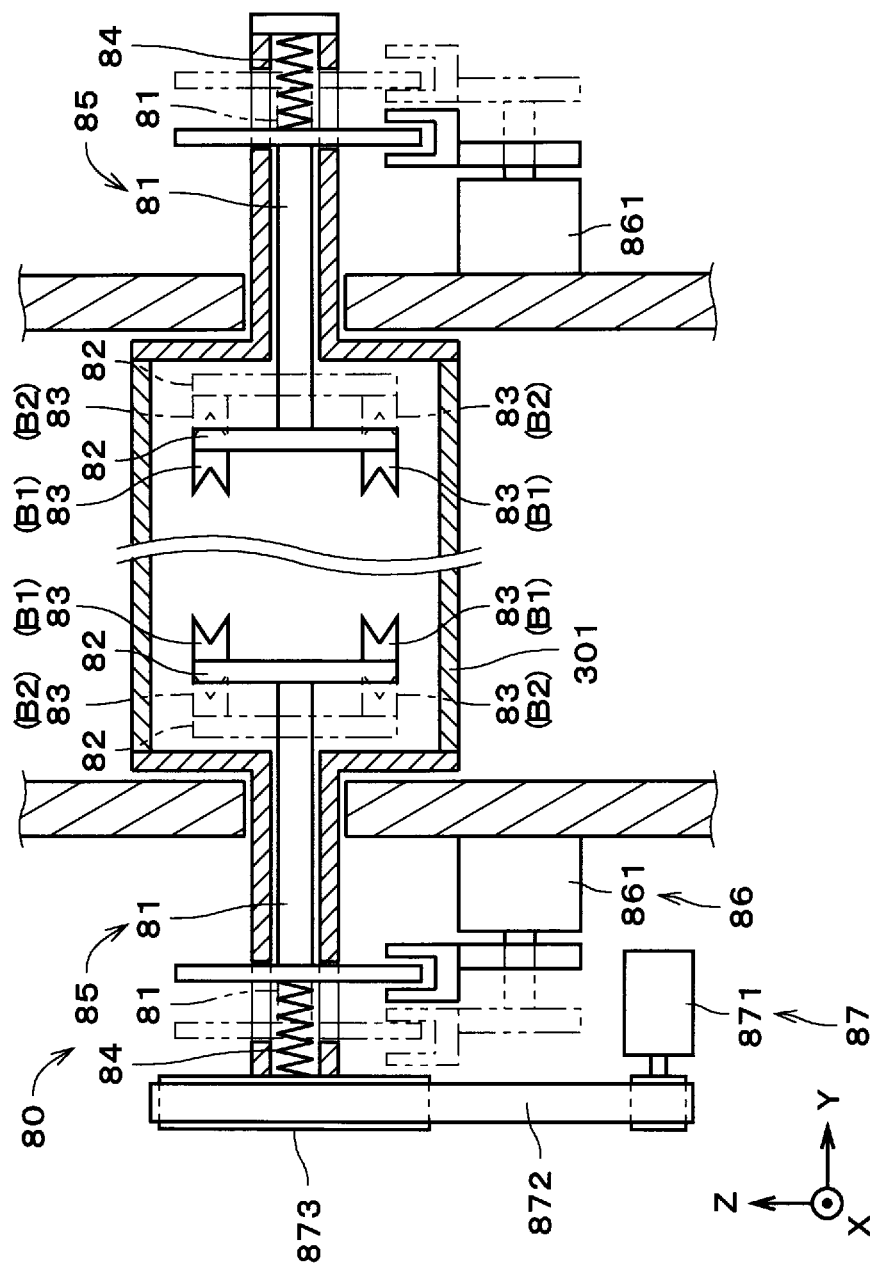
FIG. 8 is a partial enlarged view of the essential part of a catch-and-hold inversion mechanism.

Next, a configuration of the catch-and-hold inversion mechanism 80 will be described with reference to FIGS. 5 to 8. FIG. 8 is a partial enlarged view of the essential part of the catch-and-hold inversion mechanism 80. The catch-and-hold inversion mechanism 80 includes a pair of inversion catch-and-hold parts 85, a catch-and-hold part moving mechanism 86, and a rotation mechanism 87. The two inversion catch-and-hold parts 85 are disposed at approximately the same position in the up-down direction on both sides in the right-left direction (i.e., width direction) of substrates 9. Each inversion catch-and-hold part 85 includes a slide shaft 81, a support strut 82, and two catch-and-hold members 83. The catch-and-hold part moving mechanism 86 includes a pair of cylinders 861 disposed on both right and left sides of the casing 301. The rotation mechanism 87 is disposed on, for example, the −Y side of the casing 301.

The slide shaft 81 of each inversion catch-and-hold part 85 extends through a side wall in the right-left direction of the casing 301. The slide shafts 81 are rod-like members that extend approximately linearly in the Y direction. The slide shafts 81 are each installed between the two oblique shafts 71 provided in the side wall. The widthwise inner ends of the slide shafts 81 are located inside the casing 301. The widthwise inner ends of the slide shafts 81 are connected to the center portions of the support struts 82 that extend in the up-down direction.

The catch-and-hold members 83 that extend widthwise inward in the right-left direction are connected in a cantilever manner to the upper and lower end portions of the support struts 82. For example, the catch-and-hold members 83 are members each having, in cross section, a V-shaped tapered face into which the edge portion of a substrate 9 enters. The two catch-and-hold members 83 that are connected to the upper end portions of the two support struts 822 are located at approximately the same position in the up-down direction. The two catch-and-hold members 832 that are connected to the lower end portions of the two support struts 82 are also located at approximately the same position in the up-down direction. These four catch-and-hold members 83 are located on an extension of the diameter of a substrate 9 that extends in the Y direction.

The widthwise outer end portion of each slide shaft 81 is located outside the casing 301. The widthwise outer end portion of each slide shaft 81 is in contact with an elastic member 84 that shrinks in the Y direction. The elastic member 84 is, for example, a coil spring. Each slide shaft 81 is always pressed in the direction approaching the other slide shaft 81 by the elastic member 84. In the substrate inverting device 100, a pair of catch-and-hold members 83 is disposed on the right and left of a substrate 9 supported by the supporting mechanism 70, with the substrate 9 therebetween. Then, this pair of catch-and-hold members 83 is pressed inward in the width direction by the pair of elastic members 84, so that the catch-and-hold members 83 are biased toward the side surface of the substrate 9. As a result, the peripheral edge portion of the substrate 9 in a horizontal posture is caught and held by the pair of catch-and-hold members 83.

The widthwise outer end portion of each slide shaft 81 is connected to one cylinder 861 of the catch-and-hold part moving mechanism 86 via, for example, a flange part that extends like a flange from the end portion of the slide shaft 81. The direction in which the cylinder 861 advances and retracts is approximately parallel to the right-left direction. When the cylinder 861 is driven, the slide shaft 81 is moved in the right-left direction.

In the substrate inverting device 100, when the pair of cylinders 861 of the catch-and-hold part moving mechanism 86 is driven, each catch-and-hold member 83 is moved together with the slide shaft 81 from a catch-and-hold position B1 at which the catch-and-hold member 83 is biased toward the side surface of a substrate 9 to a retracted position B2 that is spaced outward in the width direction from the substrate 9. In FIGS. 7 and 8, the catch-and-hold members 83 and other parts positioned at the retracted position B2 are indicated by dashed double-dotted lines. Each catch-and-hold member 83 positioned at the retracted position B2 is moved together with the slide shaft 81 to the catch-and-hold position B1 by the catch-and-hold part moving mechanism 86 and the elastic member 84.

The rotation mechanism 87 includes a motor 871, a belt 872, and a pulley 873. The pulley 873 is connected to the slide shaft 81 on the −Y side outside the casing 301. The belt 872 transmits rotation of the motor 871 to the pulley 873. When the motor 871 is driven, the pulley 873 is rotated about a rotation axis extending in the Y direction. This rotation axis passes through approximately the center of the slide shaft 81. In the substrate processing apparatus 1, when the rotation mechanism 87 is driven while each guide part 74 of the supporting mechanism 70 is retracted at the retracted position A2, the slide shafts 81 are rotated 180 degrees together with the pulley 873, so that the substrate 9 caught and held by each pair of catch-and-hold members 83 is inverted. In the example illustrated in FIG. 7, the two substrates 9 arranged in the up-down direction are inverted at one time.

Figure 9:
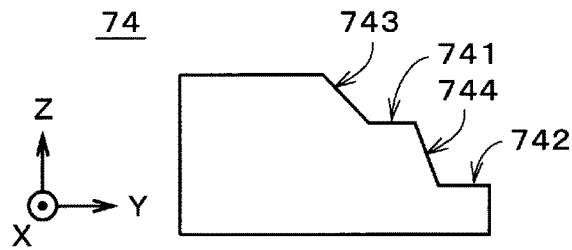
FIG. 9 is an enlarged view of a guide part.
Figure 10:
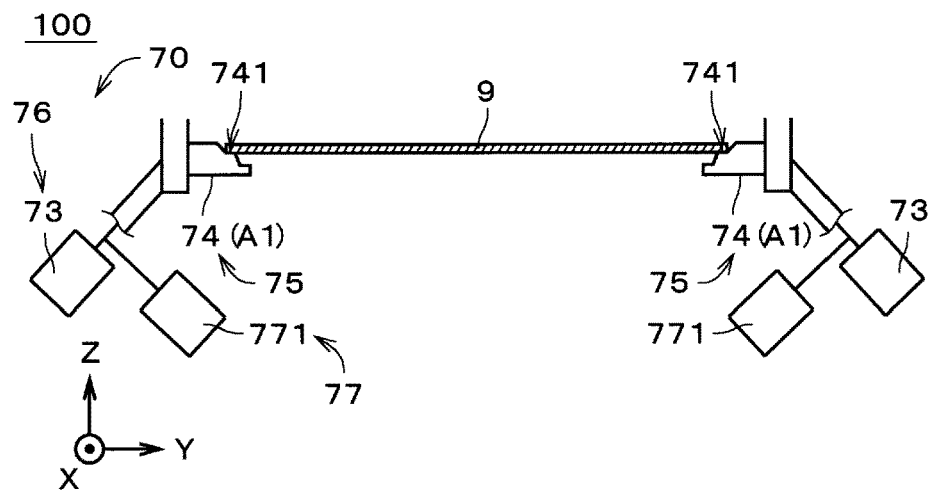
FIG. 10 illustrates a state in which a substrate is supported by guide parts.
Figure 11:
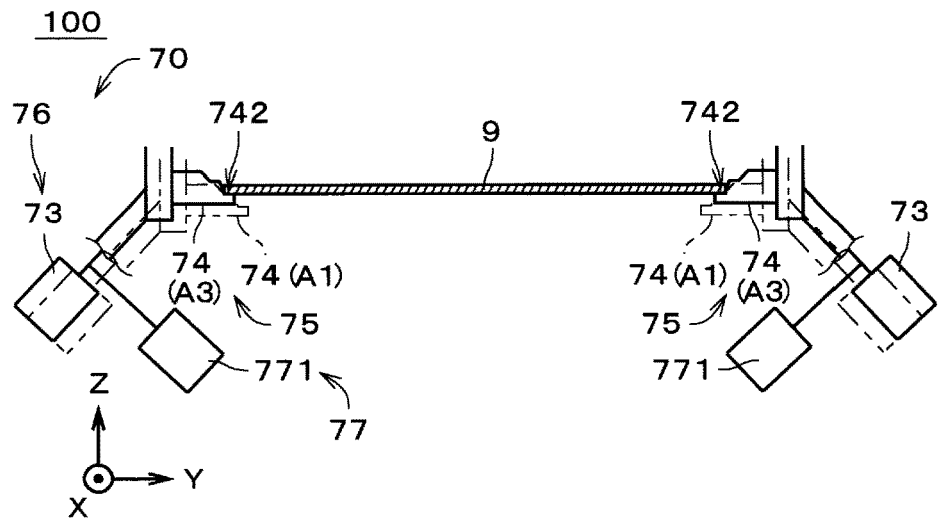
FIG. 11 illustrates a state in which the substrate is supported by the guide parts.

Next, the shape and movement of the guide parts 74 will be described with reference to FIGS. 9 to 11. FIG. 9 is an enlarged view of one guide part 74. The other three guide parts 74 also have the same structure as that illustrated in FIG. 9. FIGS. 10 and 11 illustrate a state in which a substrate 9 is supported by guide parts 74. To facilitate the understanding of the drawings, parts such as the upper guide parts 74 of the supporters 75 and the casing 301 are not shown in FIGS. 10 and 11. The same applies to FIGS. 14 to 17, which will be described later.

As illustrated in FIG. 9 the guide part 74 has a plurality of stepped surfaces that come in contact with a substrate 9 on the widthwise inner side. The guide part 74 has an upper contact surface 741, a lower contact surface 742, an upper side surface 743, and a lower side surface 744. The upper contact surface 741 and the lower contact surface 742 are surfaces facing upward. The upper contact surface 741 and the lower contact surface 742 are located at different positions in the up-down direction and in the width direction. Specifically, the lower contact surface 742 is located below and inward in the width direction of the upper contact surface 741. For example, the upper contact surface 741 and the lower contact surface 742 are surfaces that are approximately perpendicular to the up-down direction. The upper contact surface 741 and the lower contact surface 742 may be surfaces that are slightly inclined relative to the up-down direction. For example, the upper contact surface 741 and the lower contact surface 742 may be inclined surfaces that are inclined downward to the inside in the width direction.

The upper side surface 743 is a surface that extends upward from the widthwise outer edge of the upper contact surface 741. The lower side surface 744 is a surface that extends upward from the widthwise outer edge of the lower contact surface 742 to the widthwise inner edge of the upper contact surface 741. The lower contact surface 742, the lower side surface 744, the upper contact surface 741, and the upper side surface 743 of the guide part 74 are continuous in stepwise form from the lower side to the upper side.

FIG. 10 illustrates a state in which a substrate 9 is supported by the guide parts 74 positioned at the aforementioned support position A1. In the example illustrated in FIG. 10, the upper contact surface 741 of the guide part 74 on the +Y side and the upper contact surface 741 of the guide part 74 on the −Y side are in contact with the peripheral edge portion of the lower surface of the substrate 9 in a horizontal posture. Also, the side surface of the substrate 9 is in contact with the upper side surface 743 (see FIG. 9) of each guide part 74. The lower contact surface 742 and the lower side surface 744 (see FIG. 9) of each guide part 74 are not in contact with the substrate 9.

FIG. 11 illustrates a state of the guide parts 74 that have been moved outward in the width direction and upward by a relatively small distance from the support position A1. In FIG. 11, the guide parts 74 and other parts in FIG. 10 are indicated by dashed double-dotted lines. The position of the substrate 9 in FIG. 11 is the same as the position of the substrate 9 in FIG. 10. In the example illustrated in FIG. 11, the lower contact surface 742 of the guide part 74 on the +Y side and the lower contact surface 742 of the guide part 74 on the −Y side are in contact with the peripheral edge portion of the lower surface of the substrate 9. Also, the side surface of the substrate 9 is in contact with the lower side surface 744 (see FIG. 9) of each guide part 74. The upper contact surface 741 and the upper side surface 743 (see FIG. 9) of each guide part 74 are not in contact with the substrate 9.

In the following description, the position (i.e., support position A1) of the guide parts 74 illustrated in FIG. 10 is also referred to as a "first contact position A1." The position of the guide parts 74 illustrated in FIG. 11 is also referred to as a "second contact position A3." Also, the first contact position A1, the second contact position A3, and the path of movement of the guide parts 74 between the first contact position A1 and the second contact position A3 are collectively referred to as a "contact position."

The movement of the guide parts 74 between the first contact position A1 and the second contact position A3 is implemented by the switching drive parts 771 of the switching mechanism 77. On each of the +Y and −Y sides of the casing 301, one switching drive part 771 collectively moves one cylinder 73 of the guide moving mechanism 76 and the two supporters 75 connected to that cylinder 73. In other words, the switching mechanism 77 moves the guide parts 74 together with the guide moving mechanism 76. In the case of moving the guide parts 74 from the first contact position A1 to the second contact position A3, the switching drive parts 771 move the cylinders 73 and the supporters 75 upward and outward in the width direction. In the case of moving the guide parts 74 from the second contact position A3 to the first contact position A1, the switching drive parts 771 move the cylinders 73 and the supporters 75 downward and inward in the width direction. The direction in which the cylinders 73 and the guide parts 74 are moved by the switching drive parts 771 is approximately perpendicular to the direction in which the guide parts 74 are moved by the cylinders 73.

The switching drive parts 771 of the switching mechanism 77 switch the positions of the guide parts 74 positioned at the contact position between the first contact position A1 and the second contact position A3. Accordingly, the state of contact between the guide parts 74 and substrates 9 (i.e., the area where the guide parts 74 come in contact with the substrates 9) is changed. In the following description, regions of the guide parts 74 that come in contact with the peripheral edge portions of substrates 9 at the first contact position A1 are referred to as "first contact regions," and regions thereof that come in contact with the peripheral edge portions of substrates 9 at the second contact position A3 are referred to as "second contact regions." In the examples illustrated in FIGS. 10 and 11, the upper contact surfaces 741 of the guide parts 74 serve as first contact regions, and the lower contact surfaces 742 thereof serve as second contact regions. That is, the second contact region of each guide part 74 is located below and inward in the width direction of the first contact region.

The distance in the width direction between a pair of right and left guide parts 74 positioned at the first contact position A1 (e.g., distance in the width direction between the inner edges of the pair of guide parts 74) is smaller than the distance in the width direction between the pair of guide parts 74 positioned at the second contact position A3. Also, the distance in the width direction between the outer edges of the upper contact surfaces 741 of the pair of guide parts 74 positioned at the first contact position A1 is approximately the same as the distance in the width direction between the outer edges of the lower contact surfaces 742 of the pair of guide parts 74 positioned at the second contact position A3.

Figure 12:
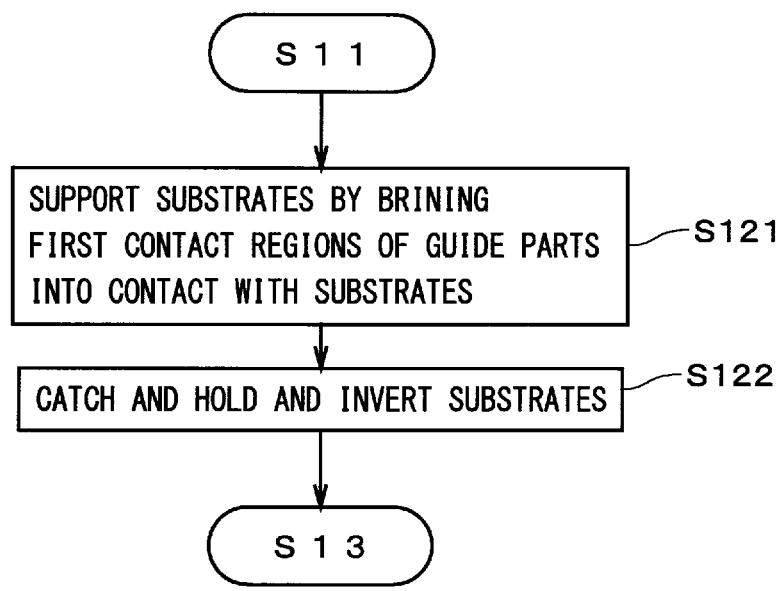
FIG. 12 is a flowchart of substrate inversion.
Figure 13:
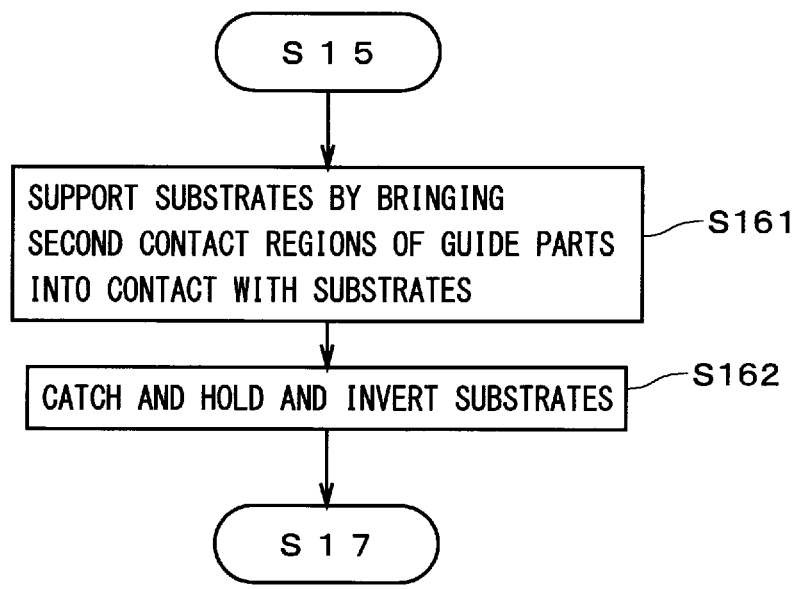
FIG. 13 is a flowchart of substrate inversion.

In the substrate inverting device 100, for example, in the case of inverting unprocessed substrates 9 transported from the indexer cell 10 into the inversion unit 30 in step S12 described above, each guide part 74 is positioned at the first contact position A1 of the contact position and supports a substrate 9, with its upper contact surface 741 coming in contact with the lower surface of the peripheral edge portion of the substrate 9 (step S121 in FIG. 12). Then, the catch-and-hold inversion mechanism 80 catches and holds the substrates 9 supported by the supporting mechanism 70 and inverts the substrates 9 after each guide part 74 is retracted to the retracted position A2 (step S122). Also, in the case of inverting substrates 9 that have undergone the back-surface cleaning processing and have been transported from the cleaning processing cell 20 into the inversion unit 30 in step S16 described above, each guide part 74 is positioned at the second contact position A3 of the contact position and supports a substrate 9, with its lower contact surface 742 coming in contact with the lower surface of the peripheral edge portion of the substrate 9 (step S161 in FIG. 13). Then, the catch-and-hold inversion mechanism 80 catches and holds the substrates 9 supported by the supporting mechanism 70 and inverts the substrates 9 after each guide part 74 is retracted to the retracted position A2 (step S162). Alternatively, the guide parts 74 positioned at the second contact position A3 may support unprocessed substrates 9, and the guide parts 74 positioned at the first contact position A1 may support substrates 9 that have undergone the back-surface cleaning processing.

As described thus far, the substrate inverting device 100 includes the supporting mechanism 70 and the catch-and-hold inversion mechanism 80. The supporting mechanism 70 comes in contact with the peripheral edge portions of substrates 9 in a horizontal posture and supports the substrates 9 from below. The catch-and-hold inversion mechanism 80 catches and holds the substrates 9 supported by the supporting mechanism 70 and inverts the substrates 9. The supporting mechanism 70 includes a pair of guide parts 74, the guide moving mechanism 76, and the switching mechanism 77. The pair of guide parts 74 comes in contact with the peripheral edge portion of a substrate 9 on both sides in the width direction of the substrate 9. The guide moving mechanism 76 advances and retracts the pair of guide parts 74 between the contact position that comes in contact with the substrate 9 and the retracted position A2 that is farther away from the substrate 9 than the contact position. The switching mechanism 77 changes the condition of contact between the pair of guide parts 74 and the substrate 9 by switching the positions of the pair of guide parts 74 positioned at the contact position between the first contact position A1 and the second contact position A3.

The two guide parts 74 each has the first contact region and the second contact region. The first contact region (i.e., upper contact surface 741) comes in contact with the peripheral edge portion of a substrate 9 at the first contact position A1. The second contact region (i.e., lower contact surface 742) is located at a position different in the up-down direction and the width direction from the position of the first contact region and comes in contact with the peripheral edge portion of a substrate 9 at the second contact position A3.

In the substrate inverting device 100, the regions of contact of the guide parts 74 with substrates 9 can be switched between the first contact region and the second contact region in accordance with the state (e.g., unprocessed or processed) of the substrates 9. As a result, it is possible to, for example, prevent grime, particles, or the like on unprocessed substrates 9 from adhering to processed and cleaned substrates 9 via the regions of contact of the guide parts 74 with the substrates 9.

As described above, in the substrate inverting device 100, the second contact region (i.e., lower contact surface 742) of each of the pair of guide parts 74 is located below and inward in the width direction of the first contact region (i.e., upper contact surface 741). The switching mechanism 77 switches the positions of the pair of guide parts 74 between the first contact position A1 and the second contact position A3 by changing the distance in the width direction between the pair of guide parts 74. This facilitates the switching of the positions of the pair of guide parts 74.

Also, the switching mechanism 77 switches the positions of the pair of guide parts 74 between the first contact position A1 and the second contact position A3 by moving the pair of guide parts 74 together with the guide moving mechanism 76. This simplifies a mechanism for advancing and retracting the pair of guide parts 74 (i.e., movement between the contact position and the retracted position A2) and a mechanism for switching the positions of the pair of guide parts 74 positioned at the contact position.

As described above, the direction in which each guide part 74 is moved by the guide moving mechanism 76 is inclined relative to the up-down direction and the width direction. This reduces the distance of movement of the guide parts 74 in the width direction in the case of moving the guide parts 74 between the contact position and the retracted position A2. As a result, it is possible to suppress an increase in the size in the width direction of the substrate inverting device 100.

In the substrate inverting device 100, the first contact region and the second contact region (i.e., the upper contact surface 741 and the lower contact surface 742) of each of the pair of guide parts 74 are contact surfaces facing upward, and the first contact region and the second contact region thereof are connected in stepwise form. This facilitates the formation of the first contact regions and the second contact regions of the guide parts 74. Also, it is possible to favorably suppress movement of particles or the like between the first contact regions and the second contact regions.

The substrate processing apparatus 1 includes the substrate inverting device 100, the back-surface cleaning processing parts 24, and the transport robot 22 serving as a substrate transporter. The back-surface cleaning processing parts 24 clean the back surfaces of substrates 9 inverted by the substrate inverting device 100. The transport robot 22 transports substrates 9 between the substrate inverting device 100 and the back-surface cleaning processing parts 24. As described above, in the substrate inverting device 100, the regions of contact of the guide parts 74 with substrates 9 can be switched in accordance with the state of the substrates 9. Accordingly, the inversion of unprocessed substrates 9 and the inversion of substrates 9 that have undergone back-surface cleaning processing can be implemented by one substrate inverting device 100 while preventing the adhesion of particles or the like to the substrates 9. As a result, the time required to process the substrates 9 can be shortened. Moreover, the size of the substrate processing apparatus 1 can be reduced, as compared with the case where a plurality of substrate inverting devices are provided in accordance with the state of substrates 9.

As described above, the substrate processing apparatus 1 further includes the cleaning processing cell 20, which is a cleaning processing block, and the indexer cell 10, which is an indexer block. The cleaning processing cell 20 has disposed therein the back-surface cleaning processing parts 24 and the transport robot 22 serving as a substrate transporter. The indexer cell 10 has disposed therein the transfer robot 12 serving as another substrate transporter. The indexer cell 10 passes unprocessed substrates 9 to the cleaning processing cell 20 and receives processed substrates 9 from the cleaning processing cell 20. The substrate inverting device 100 is disposed at the connection between the cleaning processing cell 20 and the indexer cell 10. In the case where one transporter out of the transport robot 22 and the transfer robot 12 transports substrates 9 into the substrate inverting device 100, the substrates 9 are inverted by the substrate inverting device 100 and transported out of the substrate inverting device 100 by the other transporter. In this way, the substrate inverting device 100 is used to invert substrates 9 and to receive and pass substrates 9 between the indexer cell 10 and the cleaning processing cell 20. This further shortens the time required for the substrate processing apparatus 1 to process substrates 9.

The substrate processing apparatus 1 does not necessarily have to perform cleaning processing on the front and back surfaces of substrates 9, and for example, may perform cleaning processing on only the front surfaces of substrates 9 by using the front-surface cleaning processing parts 23. Alternatively, the substrate processing apparatus 1 may perform cleaning processing on only the back surfaces of substrates 9 by using the back-surface cleaning processing parts 24.

In the case where the substrate processing apparatus 1 performs cleaning processing on only the back surfaces of substrates 9, the substrates 9 that have undergone back-surface cleaning processing performed in the cleaning processing cell 20 are transported into the substrate inverting device 100 by the transport robot 22, inverted by the substrate inverting device 100, and then transported out by the transfer robot 12 of the indexer cell 10. In this case as well, the time required to process substrates 9 can be further shortened as described above.

Figure 14:
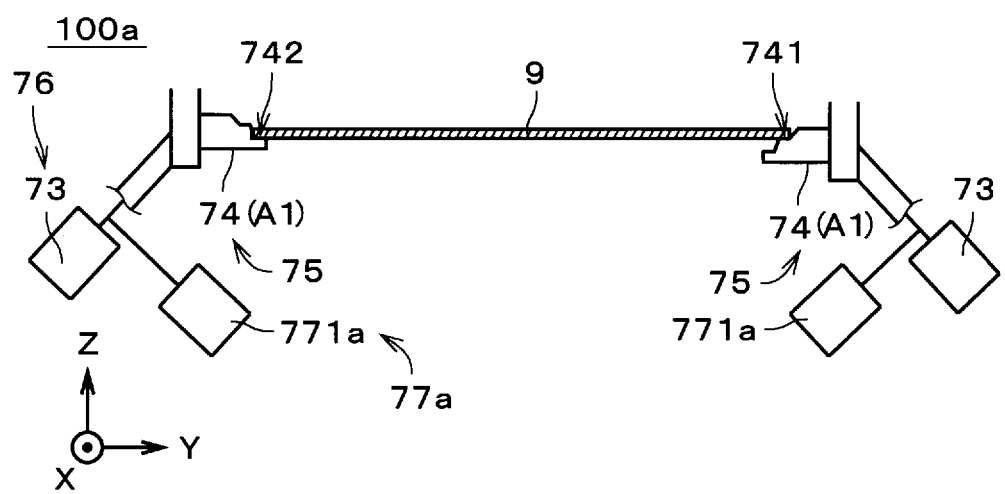
FIG. 14 illustrates a state in which a substrate is supported by guide parts of another substrate inverting device.
Figure 15:
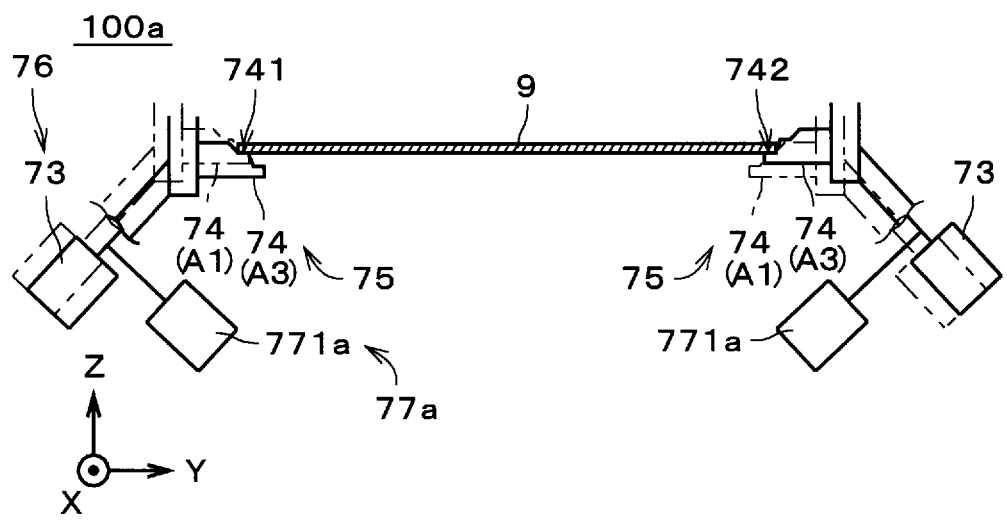
FIG. 15 illustrates a state in which the substrate is supported by the guide parts.

Next, another preferable substrate inverting device will be described. FIGS. 14 and 15 illustrate a state in which a substrate 9 is supported by guide parts 74 of a substrate inverting device 100a. The shape of the guide parts 74 is the same as that illustrated in FIG. 9. FIG. 14 illustrates a state in which the substrate 9 is supported by the guide parts 74 positioned at the first contact position A1. FIG. 15 illustrates a state in which the substrate 9 is supported by the guide parts 74 positioned at the second contact position A3. In FIG. 15, the positions of the guide parts 74 and other parts in FIG. 14 are indicated by dashed double-dotted lines. The position of the substrate 9 in FIG. 15 is the same as the position of the substrate 9 illustrated in FIG. 14.

In the example illustrated in FIG. 14, the upper contact surface 741 of the guide part 74 on the +Y side and the lower contact surface 742 of the guide part 74 on the −Y side are in contact with the peripheral edge portion of the lower surface of the substrate 9 in a horizontal posture. Also, the upper side surface 743 of the guide part 74 on the +Y side and the lower side surface 744 of the guide part 74 on the −Y side (see FIG. 9) are in contact with the side surface of the substrate 9. The lower contact surface 742 of the guide part 74 on the +Y side and the upper contact surface 741 of the guide part 74 on the −Y side (see FIG. 9) are not in contact with the substrate 9.

In the example illustrated in FIG. 15, the lower contact surface 742 of the guide part 74 on the +Y side and the upper contact surface 741 of the guide part 74 on the −Y side are in contact with the peripheral edge portion of the lower surface of the substrate 9 in a horizontal posture. Also, the lower side surface 744 of the guide part 74 on the +Y side and the upper side surface 743 of the guide part 74 on the −Y side (see FIG. 9) are in contact with the side surface of the substrate 9. The upper contact surface 741 of the guide part 74 on the +Y side and the lower contact surface 742 of the guide part 74 on the −Y side (see FIG. 9) are not in contact with the substrate 9.

In the same manner as described above, regions of the guide parts 74 that come in contact with the peripheral edge portion of the substrate 9 at the first contact position A1 are referred to as "first contact regions," and regions thereof that come in contact with the peripheral edge portion of the substrate 9 at the second contact position A3 are referred to as "second contact regions." In the examples illustrated in FIGS. 14 and 15, the upper contact surface 741 of the guide part 74 on the +Y side and the lower contact surface 742 of the guide part 74 on the −Y side serve as first contact regions, and the lower contact surface 742 of the guide part 74 on the +Y side and the upper contact surface 741 of the guide part 74 on the −Y side serve as second contact regions. In other words, the second contact region of the guide part 74 on the +Y side is located below and inward in the width direction of the first contact region, and the second contact region of the guide part 74 on the −Y side is located above and outward in the width direction of the first contact region.

The movement of the guide parts 74 between the first contact position A1 and the second contact position A3 is implemented by a switching mechanism 77a. In other words, the switching mechanism 77a switches the positions of the guide parts 74 positioned at the contact position between the first contact position A1 and the second contact position A3. The switching mechanism 77a includes a pair of switching drive parts 771a. The switching drive parts 771a are, for example, cylinders. Like the aforementioned switching mechanism 77, the switching mechanism 77a moves the guide parts 74 together with the cylinders 73 of the guide moving mechanism 76. The direction in which the cylinders 73 and the guide parts 74 are moved by the switching drive parts 771a is approximately perpendicular to the direction in which the guide parts 74 are moved by the cylinders 73.

In the case of moving the guide part 74 on the +Y side from the first contact position A1 to the second contact position A3, the switching drive part 771a moves the cylinder 73 and the supporter 75 upward and outward in the width direction. In the case of moving the guide part 74 on the −Y side from the first contact position A1 to the second contact position A3, the switching drive part 771a moves the cylinder 73 and the supporter 75 downward and inward in the width direction. In the case of moving the guide part 74 on the +Y side from the second contact position A3 to the first contact position A1, the switching drive part 771a moves the cylinder 73 and the supporter 75 downward and inward in the width direction. In the case of moving the guide part 74 on the −Y side from the second contact position A3 to the first contact position A1, the switching drive part 771a moves the cylinder 73 and the supporter 75 upward and outward in the width direction.

The distance in the width direction between the pair of right and left guide parts 74 positioned at the first contact position A1 (e.g., distance in the width direction between the inner edges of the pair of guide parts 74) is approximately the same as the distance in the width direction between the pair of guide parts 74 positioned at the second contact position A3.

In the case where the pair of guide parts 74 is positioned at the first contact position A1, the upper contact surface 741, i.e., the first contact region, of the guide part 74 on the +Y side and the lower contact surface 742, i.e., the first contact region, of the guide part 74 on the −Y side are positioned at the same position in the up-down direction. On the other hand, the lower contact surface 742, i.e., the second contact region, of the guide part 74 on the +Y side is positioned below the upper contact surface 741, i.e., the second contact region, of the guide part 74 on the −Y side.

In the case where the pair of guide parts 74 is positioned at the second contact position A3, the lower contact surface 742, i.e., the second contact region, of the guide part 74 on the +Y side and the upper contact surface 741, i.e., the second contact region, of the guide part 74 on the −Y side are positioned at the same position in the up-down direction. On the other hand, the upper contact surface 741, i.e., the first contact region, of the guide part 74 on the +Y side is positioned above the lower contact surface 742, i.e., the first contact region, of the guide part 74 on the −Y side.

As described above, in the substrate inverting device 100a, each of the pair of guide parts 74 has a first contact region and a second contact region. The first contact regions (i.e., the upper contact surface 741 of the guide part 74 on the +Y side and the lower contact surface 742 of the guide part 74 on the −Y side) come in contact with the peripheral edge portion of a substrate 9 at the first contact position A1. The second contact regions (i.e., the lower contact surface 742 of the guide part 74 on the +Y side and the upper contact surface 741 of the guide part 74 on the −Y side) are located at positions different in the up-down direction and the width direction from the positions of the first contact regions and come in contact with the peripheral edge portion of a substrate 9 at the second contact position A3.

Accordingly, as in the case of the substrate inverting device 100, the regions of contact of the guide parts 74 with substrates 9 can be switched between the first contact region and the second contact region in accordance with the state (e.g., unprocessed or processed) of the substrates 9. As a result, it is possible to, for example, prevent grime, particles, or the like on unprocessed substrates 9 from adhering to processed and cleaned substrates 9 via the regions of contact of the guide parts 74 with the substrates 9.

As described above, in the substrate inverting device 100a, one guide part 74 (i.e., guide part 74 on the +Y side) out of the pair of guide parts 74 has a second contact region (i.e., lower contact surface 742) that is located below and inward in the width direction of the first contact region (i.e., upper contact surface 741). Also, the other guide part 74 (i.e., guide part 74 on the −Y side) out of the pair of guide parts 74 has a second contact region (i.e., upper contact surface 741) that is located above and outward in the width direction of the first contact region (i.e., lower contact surface 742). The switching mechanism 77a switches the positions of the pair of guide parts 74 between the first contact position A1, at which the first contact regions of the pair of guide parts 74 are positioned at the same position in the up-down direction, and the second contact position A3, at which the second contact regions of the pair of guide parts 74 are positioned at the same position in the up-down direction, by moving the other guide part 74 relative to the one guide part 74 in the up-down direction. This facilitates the switching of the positions of the pair of guide parts 74.

The switching mechanism 77a also switches the positions of the pair of guide parts 74 between the first contact position A1 and the second contact position A3 by moving the pair of guide parts 74 together with the guide moving mechanism 76. This simplifies a mechanism for advancing and retracting the pair of guide parts 74 (i.e., movement between the contact position and the retracted position A2) and a mechanism for switching the positions of the pair of guide parts 74 positioned at the contact position.

In the substrate inverting device 100a, the direction in which each guide part 74 is moved by the guide moving mechanism 76 is inclined relative to the up-down direction and the width direction. This reduces the distance of movement of the guide parts 74 in the width direction in the case where the guide parts 74 are moved between the contact position and the retracted position A2. As a result, it is possible to suppress an increase in the size in the width direction of the substrate inverting device 100a.

Figure 16:
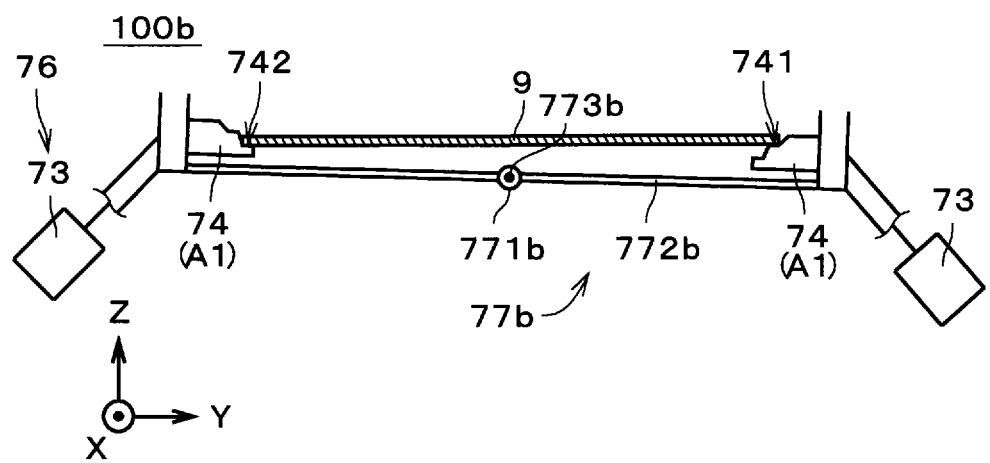
FIG. 16 illustrates a state in which a substrate is supported by guide parts of another substrate inverting device.
Figure 17:
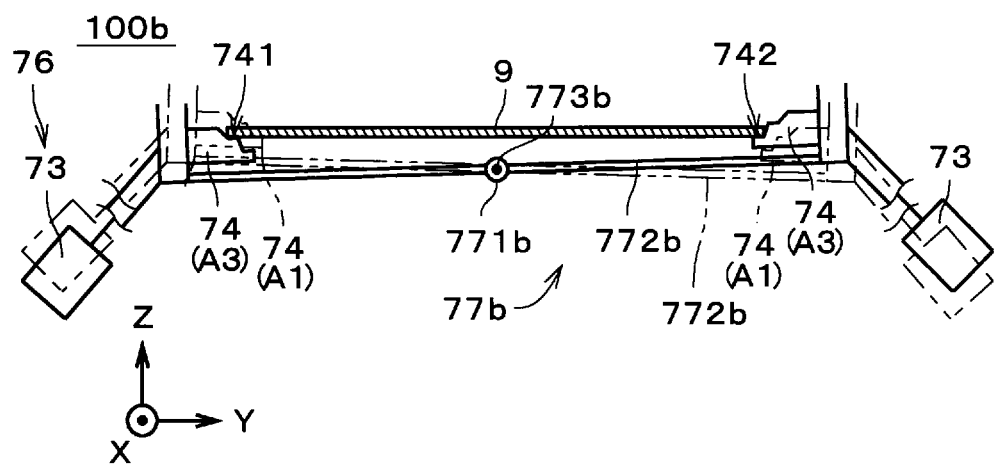
FIG. 17 illustrates a state in which the substrate is supported by the guide parts.

FIGS. 16 and 17 illustrate a state in which a substrate 9 is supported by guide parts 74 of another preferable substrate inverting device 100b. The shape of the guide parts 74 is the same as that illustrated in FIG. 9. FIG. 16 illustrates a state in which the substrate 9 is supported by the guide parts 74 positioned at the first contact position A1. FIG. 17 illustrates a state in which the substrate 9 is supported by the guide parts 74 positioned at the second contact position A3. In FIG. 17, the positions of the guide parts 74 and other parts in FIG. 16 are indicated by dashed double-dotted lines. The position of the substrate 9 in FIG. 17 is the same as the position of the substrate 9 illustrated in FIG. 16.

In the example illustrated in FIG. 16, the upper contact surface 741 of the guide part 74 on the +Y side and the lower contact surface 742 of the guide part 74 on the −Y side are in contact with the peripheral edge portion of the lower surface of the substrate 9 in a horizontal posture. The upper side surface 743 of the guide part 74 on the +Y side and the lower side surface 744 of the guide part 74 on the −Y side (see FIG. 9) are in contact with the side surface of the substrate 9. The lower contact surface 742 of the guide part 74 on the +Y side and the upper contact surface 741 of the guide part 74 on the −Y side (see FIG. 9) are not in contact with the substrate 9.

In the example illustrated in FIG. 17, the lower contact surface 742 of the guide part 74 on the +Y side and the upper contact surface 741 of the guide part 74 on the −Y side are in contact with the peripheral edge portion of the lower surface of the substrate 9 in a horizontal posture. The lower side surface 744 of the guide part 74 on the +Y side and the upper side surface 743 of the guide part 74 on the −Y side (see FIG. 9) are in contact with the side surface of the substrate 9. The upper contact surface 741 of the guide part 74 on the +Y side and the lower contact surface 742 of the guide part 74 on the −Y side (see FIG. 9) are not in contact with the substrate 9.

In the same manner as described above, regions of the guide parts 74 that come in contact with the peripheral edge portion of the substrate 9 at the first contact position A1 are referred to as "first contact regions," and regions thereof that come in contact with the peripheral edge portion of the substrates 9 at the second contact position A3 are referred to as "second contact regions." In the examples illustrated in FIGS. 16 and 17, the upper contact surface 741 of the guide part 74 on the +Y side and the lower contact surface 742 of the guide part 74 on the −Y side serve as first contact regions, and the lower contact surface 742 of the guide part 74 on the +Y side and the upper contact surface 741 of the guide part 74 on the −Y side serve as second contact regions. In other words, the second contact region of the guide part 74 on the +Y side is located below and inward in the width direction of the first contact region, and the second contact region of the guide part 74 on the −Y side is located above and outward in the width direction of the first contact region.

The movement of the guide parts 74 between the first contact position A1 and the second contact position A3 is implemented by a switching mechanism 77b. In other words, the switching mechanism 77b switches the positions of the guide parts 74 positioned at the contact position between the first contact position A1 and the second contact position A3. Like the aforementioned switching mechanism 77, the switching mechanism 77b moves the guide parts 74 together with the cylinders 73 of the guide moving mechanism 76.

The switching mechanism 77b includes a switching drive part 771b and a connection member 772b. The connection member 772b is a rod-like member that extends approximately in the Y direction and connects a pair of right and left guide parts 74. In the example illustrated in FIG. 16, the connection member 772b connects the pair of guide parts 74 via the support struts 72. The switching drive part 771 is, for example, a motor that includes a rotary shaft 773b extending in the X direction. The rotary shaft 773b of the switching drive part 771b is connected to the center portion in the Y direction of the connection member 772b. When the switching drive part 771b rotates the connection member 772b about the rotary shaft 773b, the pair of guide parts 74 is integrally rotated, and the positions of the pair of guide parts 74 are switched between the first contact position A1 and the second contact position A3.

In the case of moving the pair of guide parts 74 from the first contact position A1 to the second contact position A3, the switching drive part 771b rotates the pair of guide parts 74 counterclockwise in FIGS. 16 and 17. In the case of moving the pair of guide parts 74 from the second contact position A3 to the first contact position A1, the switching drive part 771*b* rotates the pair of guide parts 74 clockwise in FIGS. 16 and 17.

The distance in the width direction between the pair of right and left guide parts 74 positioned at the first contact position A1 (e.g., the distance in the width direction between the inner edges of the pair of guide parts 74) is approximately the same as the distance in the width direction between the pair of guide parts 74 positioned at the second contact position A3.

In the case where the pair of guide parts 74 is positioned at the first contact position A1, the upper contact surface 741, i.e., the first contact region, of the guide part 74 on the +Y side and the lower contact surface 742, i.e., the first contact region, of the guide part 74 on the −Y side are positioned at the same position in the up-down direction. On the other hand, the lower contact surface 742, i.e., the second contact region, of the guide part 74 on the +Y side is positioned below the upper contact surface 741, i.e., the second contact region, of the guide part 74 on the −Y side.

In the case where the pair of guide parts 74 is positioned at the second contact position A3, the lower contact surface 742, i.e., the second contact region, of the guide part 74 on the +Y side and the upper contact surface 741, i.e., the second contact region, of the guide part 74 on the −Y side are positioned at the same position in the up-down direction. On the other hand, the upper contact surface 741, i.e., the first contact region, of the guide part 74 on the +Y side is located above the lower contact surface 742, i.e., the first contact region, of the guide part 74 on the −Y side.

As described above, in the substrate inverting device 100*b*, each of the pair of guide parts 74 has a first contact region and a second contact region. The first contact regions (i.e., the upper contact surface 741 of the guide part 74 on the +Y side and the lower contact surface 742 of the guide part 74 on the −Y side) come in contact with the peripheral edge portion of the substrate 9 at the first contact position A1. The second contact regions (i.e., the lower contact surface 742 of the guide part 74 on the +Y side and the upper contact surface 741 of the guide part 74 on the −Y side) are located at positions different in the up-down direction and the width direction from the positions of the first contact regions and come in contact with the peripheral edge portion of the substrate 9 at the second contact position A3.

Accordingly, as in the case of the substrate inverting device 100, the regions of contact of the guide parts 74 with the substrate 9 can be switched between the first contact region and the second contact region in accordance with the state (e.g., unprocessed or processed) of the substrate 9. As a result, it is possible to, for example, prevent grime, particles, or the like on unprocessed substrate 9 from adhering to processed and cleaned substrates 9 via the regions of contact of the guide parts 74 with the substrate 9.

As described above, in the substrate inverting device 100*b*, the second contact region (i.e., lower contact surface 742) of one guide part 74 (i.e., guide part 74 on the +Y side) out of the pair of guide parts 74 is located below and inward in the width direction of the first contact region (i.e., upper contact surface 741). Also, the second contact region (i.e., upper contact surface 741) of the other guide part 74 (i.e., guide part 74 on the −Y side) out of the pair of guide parts 74 is located above and outward in the width direction of the first contact region (i.e., lower contact surface 742). The switching mechanism 77*b* switches the positions of the pair of guide parts 74 between the first contact position A1, at which the first contact regions of the pair of guide parts 74 are positioned at the same position in the up-down direction, and the second contact position A3, at which the second contact regions of the pair of guide parts 74 are positioned at the same position in the up-down direction, by rotating the pair of guide parts 74 about a rotation axis extending in the horizontal direction. This facilitates the switching of the positions of the pair of guide parts 74.

In the substrate inverting device 100*b*, the guide part 74 on the +Y side and the guide part 74 on the −Y side may be moved between the first contact position A1 and the second contact position A3 by being individually rotated by the switching mechanism 77*b*. In this case as well, it is possible to facilitate the switching of the positions of the pair of guide parts 74 in the same manner as described above.

The switching mechanism 77*b* switches the positions of the pair of guide parts 74 between the first contact position A1 and the second contact position A3 by moving the pair of guide parts 74 together with the guide moving mechanism 76. This simplifies a mechanism for advancing and retracting the pair of guide parts 74 (i.e., movement between the contact position and the retracted position A2) and a mechanism for switching the positions of the pair of guide parts 74 positioned at the contact position.

In the substrate inverting device 100*b*, the direction in which each guide part 74 is moved by the guide moving mechanism 76 is inclined relative to the up-down direction and the width direction. This reduces the distance of movement of the guide parts 74 in the width direction when the guide parts 74 are moved between the contact position and the retracted position A2. As a result, it is possible to suppress an increase in the size in the width direction of the substrate inverting device 100*b*.

The substrate inverting devices 100, 100*a*, and 100*b* and the substrate processing apparatus 1 described above may be modified in various ways.

The shape of the guide parts 74 is not limited to the shape illustrated in FIG. 9 and may be changed in various ways. For example, each guide part 74 may have, in addition to the first contact region and the second contact region, a third contact region that is located at a position different in the up-down direction and the width direction from the positions of the first contact region and the second contact region. The third contact regions come in contact with the peripheral edge portions of substrates 9 when the guide parts 74 are positioned at a third contact position different from the first contact position A1 and the second contact position A3. In this case, the regions of contact of the guide parts 74 with the substrate 9 can be switched in accordance with three types of states of substrates 9. The guide parts 74 may have four or more contact regions. The arrangement of a plurality of contact regions of each guide part 74 does not necessarily have to be a stepped arrangement, and may be changed in various ways. Also, these contact regions do not necessarily have to be contact surfaces facing upward, and the shape of the contact regions may be changed in various ways.

In the case of switching the positions of the pair of guide parts 74 between the first contact position A1 and the second contact position A3 by the switching mechanism 77, 77*a*, or 77*b*, the guide moving mechanism 76 does not necessarily have to be moved together with the pair of guide parts 74. In other words, the pair of guide parts 74 may be moved between the first contact position A1 and the second contact position A3 by the switching mechanism 77, 77*a*, or 77*b* while the guide moving mechanism 76 is at a standstill.

The direction in which the guide parts 74 are moved by the guide moving mechanism 76 (i.e., the direction of movement between the contact position and the retracted position A2) does not necessarily have to be inclined relative to the up-down direction or the width direction, and may for example be approximately parallel to the up-down direction and the width direction. Alternatively, support rods that extend upward from the guide parts 74 may be provided, and these support rods may be rotated about their upper end portions so as to move the guide parts 74 between the contact position at which the guide parts 74 come in contact with substrates 9 and the retracted position A2 that is spaced in the width direction from the contact position.

In the substrate processing apparatus 1, the arrangement and numbers of the front-surface cleaning processing parts 23, the back-surface cleaning processing parts 24, and the placement parts 41 may be appropriately changed. The substrate inverting devices 100, 100a, and 100b do not necessary have to disposed at the connection between the indexer cell 10 and the cleaning processing cell 20. The positions of the substrate inverting devices 100, 100a, and 100b may be appropriately changed.

The substrate inverting devices 100, 100a, and 100b may be used in substrate processing apparatuses other than the substrate processing apparatus 1 for performing scrub cleaning on substrates 9. For example, the substrate inverting devices 100, 100a, and 100b may be used in a coater and developer in which a processing block for performing resist coating processing on substrates and a processing block for performing development processing on substrates are disposed side by side via a substrate receiving/passing part.

Figure 18:
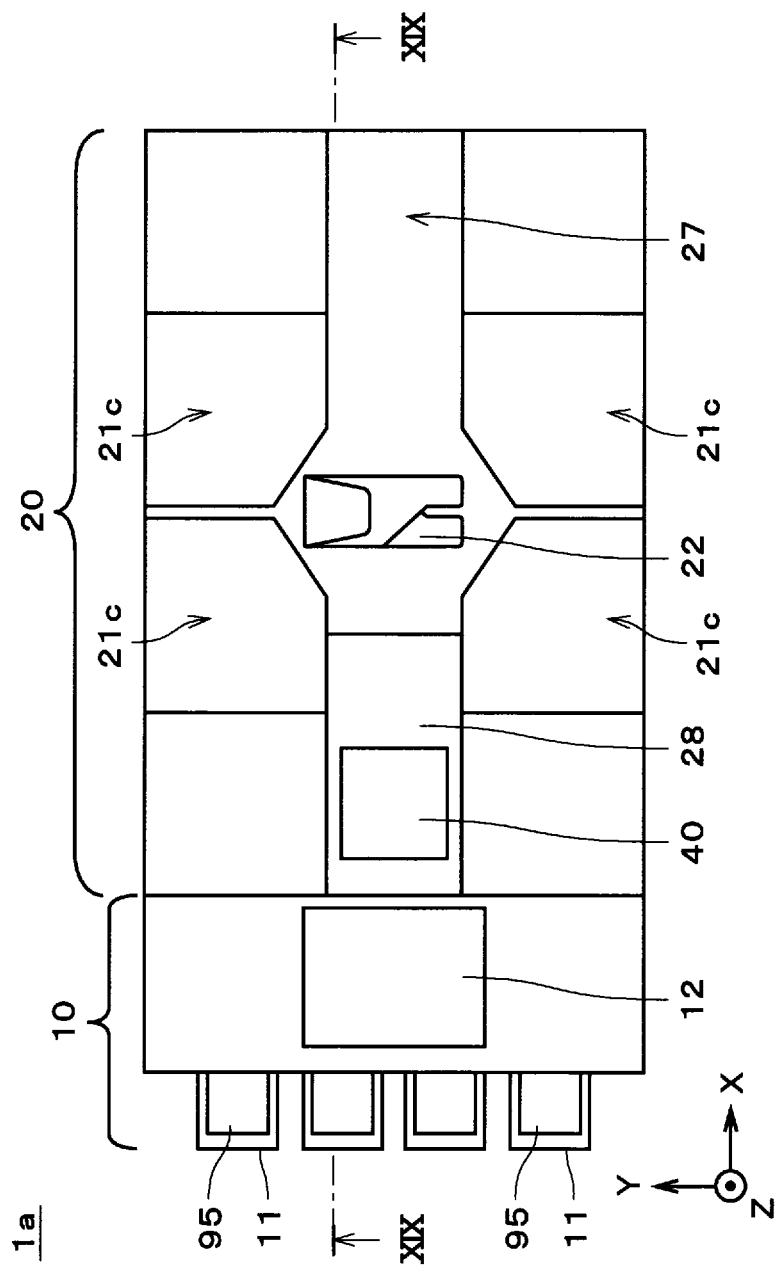
FIG. 18 is a plan view of another substrate processing apparatus.
Figure 19:
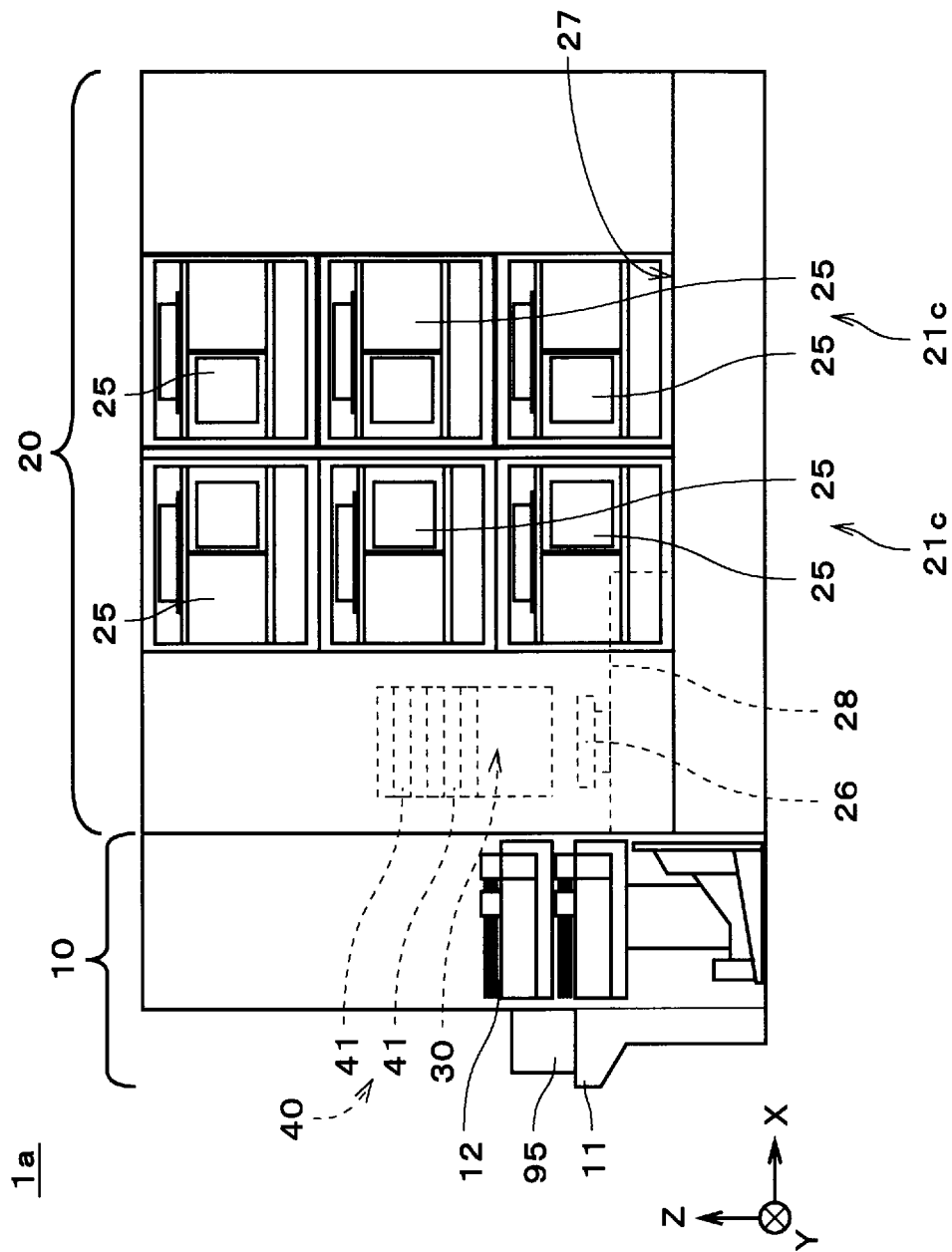
FIG. 19 is a view of the substrate processing apparatus taken along line XIX-XIX.

Also, the substrate inverting devices 100, 100a, and 100b may be used in a substrate processing apparatus 1a illustrated in FIGS. 18 and 19. FIG. 18 is a plan view of the substrate processing apparatus 1a. FIG. 19 is a view of the substrate processing apparatus 1a taken along line XIX-XIX in FIG. 18. In FIG. 19, part of the configuration in front of line XIX-XIX is also shown by broken lines.

Like the substrate processing apparatus 1 illustrated in FIG. 1, the substrate processing apparatus 1a includes an indexer cell 10 and a cleaning processing cell 20. The indexer cell 10 includes four carrier stages 11 and a transfer robot 12. Each carrier stage 11 has placed thereon a carrier 95 that can house a plurality of substrates 9.

The cleaning processing cell 20 includes a transport robot 22, four cleaning processing units 21c, an inversion unit 30, a placement unit 40, and a shuttle unit 26. The transport robot 22 moves along a path 27 that extends in the X direction at the center in the Y direction of the cleaning processing cell 20. The transport robot 22 serves as a substrate transporter that receives and passes substrates 9 from and to the inversion unit 30, the placement unit 40, the shuttle unit 26, and the cleaning processing units 21c. The four cleaning processing units 21c are disposed around the center portion of the cleaning processing cell 20. Among the four cleaning processing units 21c, two cleaning processing units 21c are disposed on the +Y side of the path 27 and the other two cleaning processing units 21c are disposed on the −Y side of the path 27. Each cleaning processing unit 21c has three cleaning processing parts 25 stacked one above another in the up-down direction. That is, the cleaning processing cell 20 includes 12 cleaning processing parts 25.

The inversion unit 30, the placement unit 40, and the shuttle unit 26 are disposed on a pedestal 28 that is disposed at the end portion on the X side of the path 27. The inversion unit 30 is disposed above the shuttle unit 26. The placement unit 40 is disposed above the inversion unit 30. The inversion unit 30 inverts substrates 9 upside down as described above. The placement unit 40 includes a plurality of placement parts 41 and is used to receive and pass substrates 9 to and from the indexer cell 10 as described above. The shuttle unit 26 holds substrates 9 and moves in the X direction on the pedestal 28. The shuttle unit 26 is used to receive and pass substrates 9 between the transfer robot 12 of the indexer cell 10 and the transport robot 22 of the cleaning processing cell 20.

The substrate inverting devices 100, 100a, and 100b do not necessarily have to be part of a substrate processing apparatus, and may be used on a standalone basis. Also, a device obtained by omitting the catch-and-hold inversion mechanism 80 from the substrate inverting devices 100, 100a, or 100b may be used as a substrate supporting device. In this case, this substrate supporting device includes a pair of guide parts 74 and a switching mechanism 77, 77a, or 77b. The pair of guide parts 74 comes in contact with the peripheral edge portion of a substrate 9 in a horizontal posture on both sides in the width direction of the substrate 9 and supports the substrate 9 from below. The switching mechanism 77, 77a, or 77b changes the state of contact between the pair of guide parts 74 and the substrates 9 by switching the positions of the pair of guide parts 74 between the first contact position A1 and the second contact position A3. Each of the pair of guide parts 74 has a first contact region and a second contact region. The first contact regions come in contact with the peripheral edge portion of a substrate 9 at the first contact position A1. The second contact regions are located at positions different in the up-down direction and the width direction from the positions of the first contact regions and come in contact with the peripheral edge portion of a substrate 9 at the second contact position A3.

This substrate supporting device can switch the regions of contact of the guide parts 74 with substrates 9 between the first contact regions and the second contact regions in accordance with the state (e.g., unprocessed or processed) of the substrates 9. As a result, it is possible to, for example, grime, particles, or the like on unprocessed substrates 9 from adhering to processed and cleaned substrates 9 via the regions of contact of the guide parts 74 with the substrates 9. Note that the substrate supporting device, the substrate inverting devices 100, 100a, and 100b, and the substrate processing apparatus 1 described above may also handle glass substrates that are used in displays such as liquid crystal displays, plasma displays, and field emission displays (FEDs), in addition to semiconductor substrates. Alternatively, the substrate supporting device, the substrate inverting devices 100, 100a, and 100b, and the substrate processing apparatus 1 described above may handle other substrates such as optical disk substrates, magnetic disk substrates, magneto-optical disk substrates, photomask substrates, ceramic substrates, and solar-cell substrates.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2017-165317 filed in the Japan Patent Office on Aug. 30, 2017, the entire disclosure of which is incorporated herein by reference.

REFERENCE SIGNS LIST 1, 1a Substrate processing apparatus
9 Substrate

10 Indexer cell
12 Transfer robot
20 Cleaning processing cell
22 Transport robot
24 Back-surface cleaning processing part
70 Supporting mechanism
74 Guide part
76 Guide moving mechanism
77, 77a, 77b Switching mechanism
80 Catch-and-hold inversion mechanism
100, 100a, 100b Substrate inverting device
741 Upper contact surface
742 Lower contact surface
773b Rotary shaft
A1 First contact position
A2 Retracted position
A3 Second contact position
S11 to S18, S121, S122, S161, S162 Step

The invention claimed is:

1. A substrate inverting device comprising:
a supporting mechanism coming in contact with a peripheral edge portion of a substrate in a horizontal posture and supporting said substrate from below;
a catch-and-hold inversion mechanism catching and holding said substrate supported by said supporting mechanism and inverting said substrate,
wherein said supporting mechanism includes:
a pair of guide parts that comes in contact with the peripheral edge portion of said substrate on both sides in a width direction of said substrate;
a guide moving mechanism advancing and retracting said pair of guide parts between a contact position at which said pair of guide parts comes in contact with said substrate and a retracted position that is farther away from said substrate than said contact position; and
a switching mechanism changing a state of contact between said pair of guide parts and said substrate by switching positions of said pair of guide parts positioned at said contact position between a first contact position and a second contact position, and
each of said pair of guide parts has:
a first contact region that comes in contact with the peripheral edge portion of said substrate at said first contact position; and
a second contact region that is located at a position different in an up-down direction and said width direction from a position of said first contact region and comes in contact with the peripheral edge portion of said substrate at said second contact position.

2. The substrate inverting device according to claim 1, wherein
said second contact region of each of said pair of guide parts is located below and inward in said width direction of said first contact region, and
said switching mechanism switches the positions of said pair of guide parts between said first contact position and said second contact position by changing a distance in said width direction between said pair of guide parts.

3. The substrate inverting device according to claim 1, wherein
said second contact region of one guide part, out of said pair of guide parts, is located below and inward in said width direction of said first contact region,
said second contact region of the other guide part, out of said pair of guide parts, is located above and outward in said width direction of said first contact region, and
said switching mechanism switches the positions of said pair of guide parts between said first contact position at which said first contact regions of said pair of guide parts are positioned at the same position in said up-down direction and said second contact position at which said second contact regions of said pair of guide parts are positioned at the same position in said up-down direction, by rotating said pair of guide parts about a rotation axis extending in a horizontal direction.

4. The substrate inverting device according to claim 1, wherein
said second contact region of one guide part, out of said pair of guide parts, is located below and inward in said width direction of said first contact region,
said second contact region of the other guide part, out of said pair of guide parts, is located above and outward in said width direction of said first contact region, and
said switching mechanism switches the positions of said pair of guide parts between said first contact position at which said first contact regions of said pair of guide parts are positioned at the same position in said up-down direction and said second contact position at which said second contact regions of said pair of guide parts are positioned at the same position in said up-down direction, by moving said other guide part relative to said one guide part in said up-down direction.

5. The substrate inverting device according to claim 1, wherein
a direction in which each guide part is moved by said guide moving mechanism is inclined relative to said up-down direction and said width direction.

6. The substrate inverting device according to claim 1, wherein
said switching mechanism switches the positions of said pair of guide parts between said first contact position and said second contact position by moving said pair of guide parts together with said guide moving mechanism.

7. The substrate inverting device according to claim 1, wherein
said first contact region and said second contact regions of each of said pair of guide parts are contact surfaces facing upward and are connected in stepwise form.

8. A substrate processing apparatus comprising:
the substrate inverting device according to claim 1;
a back-surface cleaning processing part cleaning a back surface of a substrate inverted by said substrate inverting device; and
a substrate transporter transporting said substrate between said substrate inverting device and said back-surface cleaning processing part.

9. The substrate processing apparatus according to claim 8, further comprising:
a cleaning processing block in which said back-surface cleaning processing part and said substrate transporter are disposed; and
an indexer block in which another substrate transporter is disposed and that passes an unprocessed substrate to said cleaning processing block and receives a processed substrate from said cleaning processing block,
wherein said substrate inverting device is disposed at a connection between said cleaning processing block and said indexer block, and
in a case where one transporter out of said substrate transporter and said another substrate transporter transports a substrate into said substrate inverting device, said substrate is inverted by said substrate inverting device and transported out of said substrate inverting device by the other substrate transporter.

10. A substrate supporting device comprising:

a pair of guide parts coming in contact with a peripheral edge portion of a substrate in a horizontal posture on both sides in a width direction of the substrate and supporting said substrate from below; and a switching mechanism changing a state of contact between said pair of guide parts and said substrate by switching positions of said pair of guide parts between a first contact position and a second contact position, wherein each of said pair of guide parts has:

a first contact region that comes in contact with the peripheral edge portion of said substrate at said first contact position, and a second contact region that is located at a position different in an up-down direction and said width direction from a position of said first contact region and comes in contact with the peripheral edge portion of said substrate at said second contact position.

* * * * *